(12) United States Patent
Kim et al.

(10) Patent No.: US 12,133,443 B2
(45) Date of Patent: Oct. 29, 2024

(54) DISPLAY DEVICE THAT INCLUDES OPENINGS OF A LIGHT BLOCKING MEMBER OVERLAPPING A LIGHT EMITTING LAYER OR A LIGHT RECEIVING LAYER

(71) Applicant: SAMSUNG DISPLAY CO., LTD., Yongin-si (KR)

(72) Inventors: Suk Kim, Yongin-si (KR); Gee Bum Kim, Yongin-si (KR); Tae Hoon Yang, Yongin-si (KR); Byeong Wook Yoo, Yongin-si (KR); Dae Young Lee, Yongin-si (KR); Keum Dong Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 443 days.

(21) Appl. No.: 17/511,733

(22) Filed: Oct. 27, 2021

(65) Prior Publication Data

US 2022/0285460 A1 Sep. 8, 2022

(30) Foreign Application Priority Data

Mar. 3, 2021 (KR) ........................ 10-2021-0028369

(51) Int. Cl.
*H10K 59/60* (2023.01)
*H10K 50/15* (2023.01)
(Continued)

(52) U.S. Cl.
CPC ............. *H10K 59/60* (2023.02); *H10K 50/15* (2023.02); *H10K 50/16* (2023.02); *H10K 50/84* (2023.02);
(Continued)

(58) Field of Classification Search
CPC ........ H10K 59/60; H10K 59/38; H10K 50/15; H10K 50/16; H10K 50/84; H10K 50/865;
(Continued)

(56) References Cited

U.S. PATENT DOCUMENTS 10,727,285 B2 7/2020 Chung et al.
11,086,452 B2 8/2021 Chen et al.
(Continued)

FOREIGN PATENT DOCUMENTS

CN 112038379 12/2020
WO 2020/229909 11/2020

*Primary Examiner* — Nduka E Ojeh
(74) *Attorney, Agent, or Firm* — F. CHAU & ASSOCIATES, LLC

(57) ABSTRACT

A display device including: a base layer; a backplane structure provided on the base layer, the backplane structure including pixel circuits and a sensor circuit; a pixel layer provided on the backplane structure, the pixel layer including light emitting elements respectively connected to the pixel circuits and a light receiving element connected to the sensor circuit; an encapsulation layer covering the pixel layer; a light blocking member provided on the encapsulation layer, wherein the light blocking member Includes openings overlapping the light emitting elements and the light receiving element; and a color filter provided on the encapsulation layer and covering the light blocking member wherein the light emitting elements include light emitting layers, the light receiving element includes a light receiving layer, and at least one of the openings of the light blocking member overlaps one of the light emitting layers and the light receiving layer.

20 Claims, 16 Drawing Sheets

(51) Int. Cl.
*H10K 50/16* (2023.01)
*H10K 50/84* (2023.01)
*H10K 50/86* (2023.01)
*H10K 59/121* (2023.01)
*H10K 59/122* (2023.01)
*H10K 59/131* (2023.01)
*H10K 59/38* (2023.01)
*H10K 59/40* (2023.01)

(52) U.S. Cl.
CPC ....... *H10K 50/865* (2023.02); *H10K 59/1213* (2023.02); *H10K 59/122* (2023.02); *H10K 59/131* (2023.02); *H10K 59/38* (2023.02); *H10K 59/40* (2023.02)

(58) Field of Classification Search
CPC ............. H10K 59/1213; H10K 59/122; H10K 59/131; H10K 59/40
See application file for complete search history.

(56) References Cited

U.S. PATENT DOCUMENTS

| | | |
|---|---|---|
| 2004/0113903 A1* | 6/2004 | Mikami ................. G09G 3/344 345/204 |
| 2013/0075761 A1 | 3/2013 | Akiyama |
| 2021/0005669 A1 | 1/2021 | Kamada et al. |
| 2022/0037406 A1 | 2/2022 | Kubota et al. |
| 2022/0067340 A1* | 3/2022 | Han ..................... H10K 50/865 |
| 2022/0115446 A1* | 4/2022 | Kamada ............... H01L 27/146 |
| 2023/0309364 A1* | 9/2023 | Yamazaki .............. H05B 33/04 |

* cited by examiner

DISPLAY DEVICE THAT INCLUDES OPENINGS OF A LIGHT BLOCKING MEMBER OVERLAPPING A LIGHT EMITTING LAYER OR A LIGHT RECEIVING LAYER

CROSS-REFERENCE TO RELATED APPLICATION

The present application claims priority under 35 U.S.C. § 119(a) to Korean patent application No. 10-2021-0028369 filed on Mar. 3, 2021, in the Korean Intellectual Property Office, the disclosure of which is incorporated by reference herein in its entirety,

1. TECHNICAL FIELD

The present disclosure relates to a display device including a photo sensor.

2. DISCUSSION OF RELATED ART

A display device is an output device for presentation of information in visual form. Applications for display devices continue to increase. For example, the display devices have been applied to various electronic devices such as smartphones, digital cameras, notebook computers navigation systems, and smart televisions.

Display devices may employ touch screen technologies that are responsive to a user's touch. These technologies integrate a biometric sensor for recognizing a fingerprint or the like with a display panel.

SUMMARY

In accordance with an embodiment of the present disclosure, there is provided a display device including: a base layer; a backplane structure provided on the base layer, the backplane structure including pixel circuits and a sensor circuit; a pixel layer provided on the backplane structure, the pixel layer including light emitting elements respectively connected to the pixel circuits and a light receiving element connected to the sensor circuit; an encapsulation layer covering the pixel layer; a light blocking member provided on the encapsulation layer, wherein the light blocking member includes openings overlapping the light emitting elements and the light receiving element; and a color filter provided on the encapsulation layer and covering the light blocking member, wherein the light emitting elements include light emitting layers, the light receiving element includes a light receiving layer, and at least one of the openings of the light blocking member overlaps one of the light emitting layers and the light receiving layer.

An area of at least one of the openings may be smaller than an area of the light receiving layer.

The display device may further include: a touch sensor layer provided between the encapsulation layer and the light blocking member.

The light blocking member may include a black matrix.

Each of the light emitting elements may include: a first pixel electrode provided on the backplane structure; a light emitting layer disposed on the first pixel electrode; and a second pixel electrode disposed on the light emitting layer.

The light receiving element may include: a first sensor electrode disposed in the same layer as the first pixel electrode; a light receiving layer disposed on the first sensor electrode; and a second sensor electrode disposed on the light receiving layer, and wherein the second pixel electrode and the second sensor electrode are disposed in the same layer.

The pixel layer may further include: a bank layer covering a portion of the first pixel electrode and a portion of the first sensor electrode and forming a light emitting area and a light receiving area.

Distances from respective light emitting layers of light emitting elements adjacent to the light receiving element to the light receiving layer may be substantially the same.

The light emitting layers adjacent to the light receiving element may include a first light emitting layer, a second light emitting layer, a third light emitting layer, and a fourth light emitting layer, and the first light emitting layer and the fourth light emitting layer may emit a first color, the second light emitting layer may emit a second color, and the third light emitting layer may emit a third color.

The first light emitting layer and the fourth light emitting layer may be opposite to each other with respect to the light receiving layer in a plan view.

An area of the light receiving area may be smaller than an area of the light emitting area.

Each of the light emitting elements may further include: a hole transport layer disposed between the first pixel electrode and the light emitting layer; and an electron transport layer disposed between the light emitting layer and the second pixel electrode.

The light receiving element may further include: a hole transport layer disposed between the first sensor electrode and the light receiving layer; and an electron transport layer disposed between the light receiving layer and the second sensor electrode, and wherein the electron transport layer extends onto the light emitting layer.

The light receiving layer may include a low molecular organic material.

A pixel circuit disposed on a pixel row among the pixel circuits may include: a first pixel transistor for receiving a voltage of a first power source from a first power line and generating a driving current supplied to one of the light emitting elements; a second pixel transistor connected between a data line and a first electrode of the first pixel transistor, the second pixel transistor including a gate electrode connected to a first scan line; and a third pixel transistor connected between a gate electrode of the first pixel transistor and an initialization power line, the third pixel transistor including a gate electrode connected to a second scan line, and the sensor circuit disposed on the pixel row may include: a first sensor transistor and a second sensor transistor, connected in series between a second power line to which the voltage of the first power source is supplied and a readout line; and a third sensor transistor connected between the initialization power line and the light receiving element.

A gate electrode of the third sensor transistor may be connected together with the gate electrode of the second pixel transistor to the first scan line.

A gate electrode of the second sensor transistor may be connected together with the gate electrode of the third pixel transistor to the second scan line.

The pixel circuit may further include a fourth pixel transistor connected between a second electrode of the first pixel transistor and the gate electrode of the first pixel transistor, the fourth pixel transistor may include a gate electrode connected to a third scan line, and wherein a gate electrode of the third sensor transistor may be connected together with the gate electrode of the fourth pixel transistor to the third scan line.

The initialization power line may extend in a first direction in an area corresponding to the pixel row, and the first power line, the second power line, and the readout line may extend in a second direction and are spaced apart from each other in the area corresponding to the pixel row.

The readout line may be disposed on the second power line, and may extend while overlapping the second power line.

In an area corresponding to the pixel row, two pixel circuits may be disposed between readout lines adjacent to each other.

In accordance with an embodiment of the present disclosure, there is provided a display device including: a base layer; a backplane structure provided on the base layer, the backplane structure including pixel circuits and a sensor circuit; a pixel layer provided on the backplane structure, the pixel layer including light emitting elements respectively connected to the pixel circuits and a light receiving element connected to the sensor circuit; and a black matrix provided on the pixel layer, wherein the black matrix includes openings overlapping the light emitting elements and the light receiving element, wherein the light receiving element and the light emitting elements are provided in the same layer, In accordance with an embodiment of the present disclosure, there is provided a display device including: a base layer; a backplane structure provided on the base layer, the backplane structure including pixel circuits and a sensor circuit; a pixel layer provided on the backplane structure, the pixel layer including light emitting elements respectively connected to the pixel circuits and a light receiving element connected to the sensor circuit; a touch sensor layer covering the pixel layer; a black matrix provided directly on the touch sensor layer, wherein the black matrix includes openings overlapping the light emitting elements and the light receiving element; and a color filter provided directly on the touch sensor layer and covering the black matrix.

In accordance with an embodiment of the present disclosure, the display device may include a light receiving element provided in the same layer as a light emitting element. In addition, a black matrix and color filters may be directly disposed on an encapsulation layer or a touch sensor layer. The black matrix may function as an optical pass (e.g., an optical system) of incident light supplied to the light receiving element and block reflection of external light. Thus, the amount of incident light provided to the light receiving element may be increased, and a thickness of the display device may be decreased. Accordingly, the light sensing performance of a photo sensor may be improved.

Further, a sensor circuit may also be provided in a backplane structure in which a pixel circuit is formed. In this case, the pixel circuit and the sensor circuit may share at least some signal lines (e.g., scan lines and/or an initialization power line). Thus, the manufacturing cost of the display device may be reduced, and the power consumption of the display device may be minimized.

DETAILED DESCRIPTION OF THE EMBODIMENTS

Figure 1:
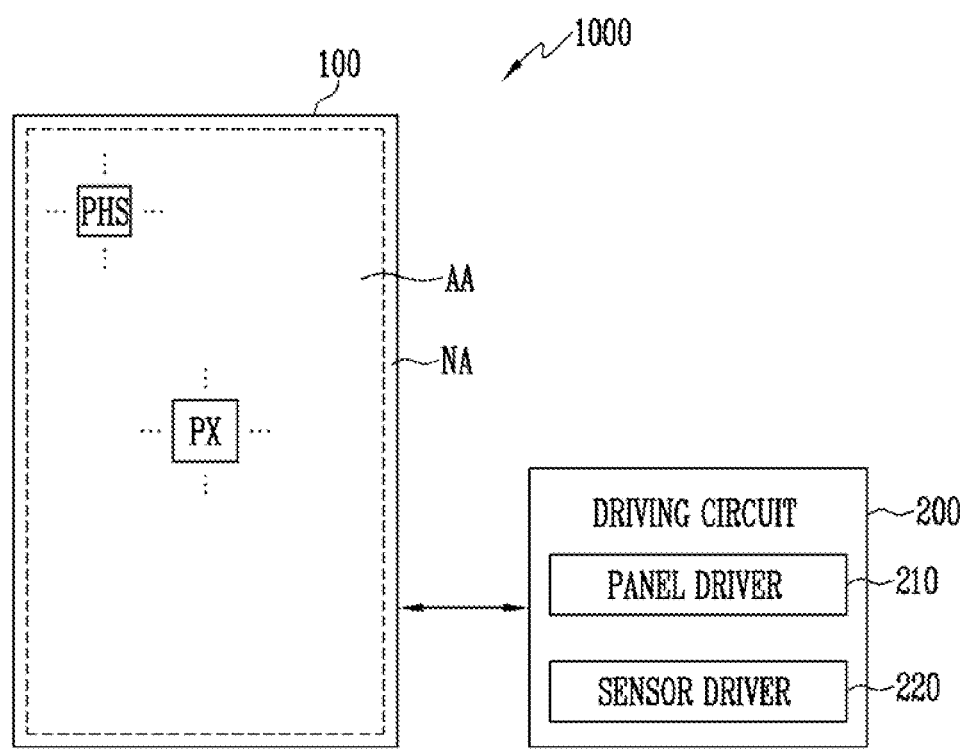
FIG. 1 is a block diagram illustrating a display device in accordance with embodiments of the present disclosure.

Hereinafter, embodiments of the present disclosure will be described in more detail with reference to the accompanying drawings. Throughout the drawings, the same reference numerals are given to the same or similar elements, and their duplicate descriptions may be omitted.

FIG. 1 is a block diagram illustrating a display device in accordance with embodiments of the present disclosure.

Referring to FIG. 1, a display device 1000 may include a display panel 100 and a driving circuit 200. In an embodiment of the present disclosure, the driving circuit 200 may include a panel driver 210 and a sensor driver 220.

The display device 1000 may be a self-luminous display device including a plurality of self-luminous elements. In particular, the display device 1000 may be an organic light emitting display device including organic light emitting elements. However, this is merely an example, and the display device 1000 may be a display device including inorganic light emitting elements, a display device including light emitting elements made of a combination of inorganic and organic materials, a liquid crystal display device, a plasma display device, a quantum dot display device, or the like.

The display device 1000 may be a flat panel display device, a flexible display device, a curved display device, a foldable display device, or a bendable display device. In addition, the display device 1000 may be a transparent display device, a head-mounted display device, a wearable display device, and the like.

The display panel 100 includes a display area AA and a non-display area NA. The display area AA may be an area in which a plurality of pixels PX (or sub-pixels) are provided. Each of the pixels PX may include at least one light emitting element. For example, the light emitting element may include a light emitting layer (or an organic light emitting layer). A portion at which light is emitted by the light emitting element may be a light emitting area. The display device 100 drives the pixels PX, corresponding to image data input from the outside, thereby displaying an image in the display area AA.

The non-display area NA may be an area provided at the periphery of the display area AA. In an embodiment of the present disclosure, the non-display area NA may be an area other than the display area AA on the display panel 100. For example, the non-display area NA may include a line area, a pad area, various dummy areas, and the like.

In an embodiment of the present disclosure, a photo sensor PHS (or a sensor pixel) may be included in the display area AA. The photo sensor PHS may include a light receiving element including a light receiving layer. The light receiving layer of the light receiving element may be spaced apart from the light emitting layer of the light emitting element in the display area AA.

In an embodiment of the present disclosure, a plurality of photo sensors PHS may be distributed throughout the entire display area AA while being spaced apart from each other. However, this is merely an example, and only a portion of the display area AA may include the photo sensors PHS and be used as a sensing area. In addition, the photo sensor PHS may be included in at least a portion of the non-display area NA.

The photo sensors PHS may sense that light emitted from a light source (e.g., a light emitting element) is reflected by an external object (e.g., a finger of a user, or the like). For example a fingerprint of the user may be sensed by the photo sensor PHS. Hereinafter, a case where the photo sensors PHS are used for fingerprint sensing is described as an example in the present disclosure. It is to be understood, however, that various biometric information such as an iris may be sensed through the photo sensors PHS.

The display device 1000 may include the panel driver 210 and the sensor driver 220. Although a case where the panel driver 210 and the sensor driver 220 are separated from each other is illustrated in FIG. 1, the present disclosure is not limited thereto. For example, at least a portion of the sensor driver 220 may be included in the panel driver 210, or operate in connection with the panel driver 210.

The panel driver 210 may scan the pixels PX of the display area AA, and supply a data signal corresponding to image data (or an image) to the pixels PX. The display panel 100 may display an image corresponding to the data signal.

In an embodiment of the present disclosure, the panel driver 210 may supply a driving signal for fingerprint sensing to the pixels PX. The driving signal may be provided to allow the pixels PX to operate as a light source for the photo sensor PHS by emitting light. In an embodiment of the present disclosure, the panel driver 210 may supply, to the photo sensor PHS, the driving signal for fingerprint sensing and/or another driving signal. However, this is merely an example, and the driving signal for fingerprint sensing may be provided by the sensor driver 220.

The sensor driver 220 may detect biometric information such as the fingerprint of the user, based on a sensing signal received from the photo sensors PHS. In an embodiment of the present disclosure, the sensor driver 220 may supply the driving signal to the photo sensor PHS and/or the pixel PX.

Figure 2:
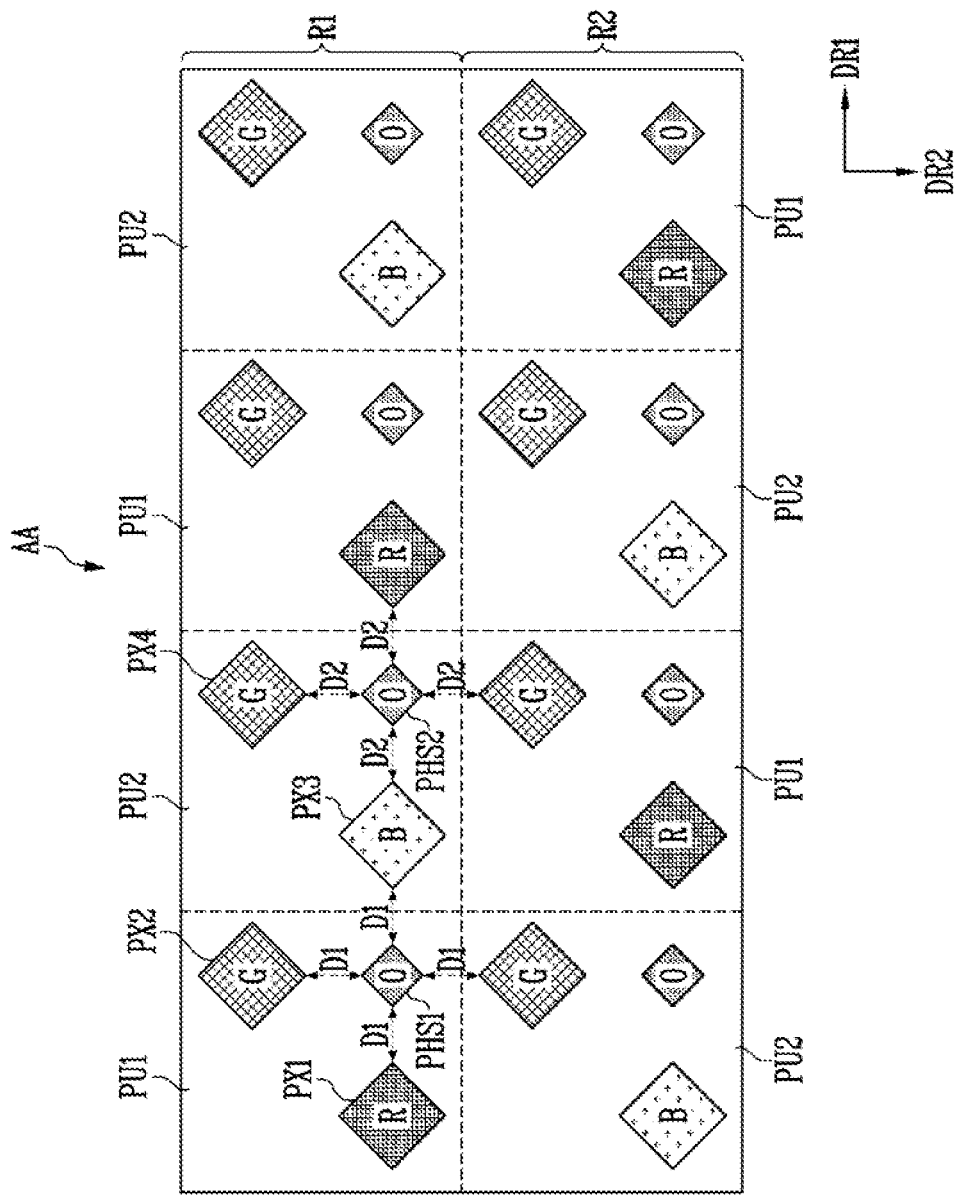
FIG. 2 is a view illustrating an example of a display area of a display panel included in the display device shown in FIG. 1.

FIG. 2 is a view illustrating an example of the display area of the display panel included in the display device shown in FIG. 1.

Referring to FIGS. 1 and 2, a plurality of pixels PX1, PX2, PX3, and PX4 and a plurality of photo sensors PHS1 and PHS2 may be disposed in the display area AA of the display panel 100.

For convenience of description, the pixels PX1, PX2, PX3, and PX4 and the photo sensors PHS1 and PHS2 may be respectively understood as a light emitting area corresponding to the light emitting layer and a light receiving area corresponding to the light receiving layer.

The display area AA may be divided into a plurality of pixel rows R1 and R2 each including the pixels PX1, PX2, PX3, and PX4 and the photo sensors PHS1 and PHS2. The pixel rows R1 and R2 may be arranged in a second direction DR2. The pixels PX1, PX2, PX3, and PX4 of each of the pixel rows R1 and R2 may be connected to the same scan lines, and be controlled by the same scan signals.

A first pixel PX1, a second pixel PX2, and a third pixel PX3 may emit first color light, second color light, and third color light, respectively. The first color light, the second color light, and the third color light may be different color lights, and each of the first color light, the second color light, and the third color light may be one of red, green, and blue. In an embodiment of the present disclosure, a fourth pixel PX4 may emit the same light as the second pixel PX2. For example, the fourth pixel PX4 may emit green light.

In an embodiment of the present disclosure, on a first pixel row R1 (or first horizontal line, or odd pixel rows) controlled by the same scan line, the first to fourth pixels PX1, PX2, PX3, and PX4 may be arranged in a first direction DR1 in a sequence of the first pixel PX1, the second pixel PX2, the third pixel PX3, and the fourth pixel PX4. The first pixel PX1 may emit red light, the second pixel PX2 may emit green light, the third pixel PX3 may emit blue light, and the fourth pixel PX4 may emit green light.

On a second pixel row R2 (or second horizontal line, or even pixel rows) controlled by a second scan line, the first to fourth pixels PX1, PX2, PX3, and PX4 may be arranged in the first direction DR1 in a sequence of the third pixel PX3, the fourth pixel PX4, the first pixel PX1, and the second pixel PX2.

A pixel arrangement of the first pixel row R1 and a pixel arrangement of the second pixel row R2 may be alternately repeated in the second direction DR2. However, this is merely an example, and the arrangement of the pixels is not limited thereto.

Although a case where the first to third pixels PX1, PX2, and PX3 have the same area is illustrated in FIG. 2, the present disclosure is not limited thereto. For example, a pixel (e.g., the third pixel PX3) emitting blue light may have an area greater than those of the other pixels.

In an embodiment of the present disclosure, the photo sensors PHS1 and PHS2 may be arranged in the first direction DR1 on the first pixel row R1. The photo sensors PHS1 and PHS2 of the first pixel row R1 may be controlled while being connected to the same scan line as the first to fourth pixels PX1, PX2, PX3 and PX4 of the first pixel row R1. In some embodiments of the present disclosure, the photo sensors PHS1 and PHS2 may sense lights having wavelengths of bands equal or similar to each other or light having wavelengths of different bands. For example, each of a first photo sensor PSH1 and a second photo sensor PHS2 may sense light of a wavelength band corresponding to one of red light, green light, and blue light.

In an embodiment of the present disclosure, the first and second photo sensors PHS1 and PHS2 may be disposed at a ratio of 1:2 with respect to the first to fourth pixels PX1, PX2, PX3, and PX4. For example, the first pixel PX1, the second pixel PX2, and the first photo sensor PHS1 may constitute a first unit PU1, and the third pixel PX3, the fourth pixel PX4, and the second photo sensor PHS2 may constitute a second unit PU2.

Therefore, according to the arrangement of the first to fourth pixels PX1, PX2, PX3, and PX4 and the first and second photo sensors PHS1 and PHS2, the first and second units PU1 and PU2 may alternately disposed in each of the first direction DR1 and the second direction DR2.

In an embodiment of the present disclosure, distances D1 (or first distances D1) from a light receiving layer (or light receiving area) of the first photo sensor PHS1 to light emitting layers (or light emitting areas) of the first to fourth pixels PX1, PX2, PX3, and PX4 adjacent thereto may be substantially the same. For example, the first pixel PX1 and the second pixel PX2, which are included in the same first unit PU, may be adjacent to the first photo sensor PHS1. In addition, the fourth pixel PX4 of the second unit PU2 adjacent to the first unit PU1 in the second direction DR2 may be adjacent to the first photo sensor PHS1. The distances D1 between the light emitting layers of the first to fourth pixels PX1, PX2, PX3, and PX4 in the first and second units PU1 and PU2 and the light receiving layer of the first photo sensor PHS1 may be substantially the same.

The distance D1 between the light emitting layer and the light receiving layer may be a shortest distance on a plane of the light emitting layer and the light receiving layer. Alternatively, the distance D1 between the light emitting layer and the light receiving layer may be a shortest width of a top surface of a bank layer (or pixel defining layer) for distinguishing the light emitting layer and the light receiving layer (e.g., the light emitting area and light receiving area, or the light emitting element and the light receiving element) from each other.

Like the first photo sensor PHS1, distances D2 (or second distances D2) from the light receiving layer (or light receiving area) of the second photo sensor PHS2 to the light emitting layers (or light emitting areas) of the first to fourth pixels PX1, PX2, PX3, and PX4 adjacent thereto may be substantially the same. In some embodiments of the present disclosure, the first distance D1 and the second distance D2 may be substantially the same. However, this is merely an example, and the first distance D1 and the second distance D2 may be different from each other.

As described above, the distances between the light receiving layer and the light emitting layer adjacent thereto are designed to be substantially the same, so that image distortion caused by inserting the light emitting element between the light emitting elements can be prevented and/or minimized.

Figure 3:
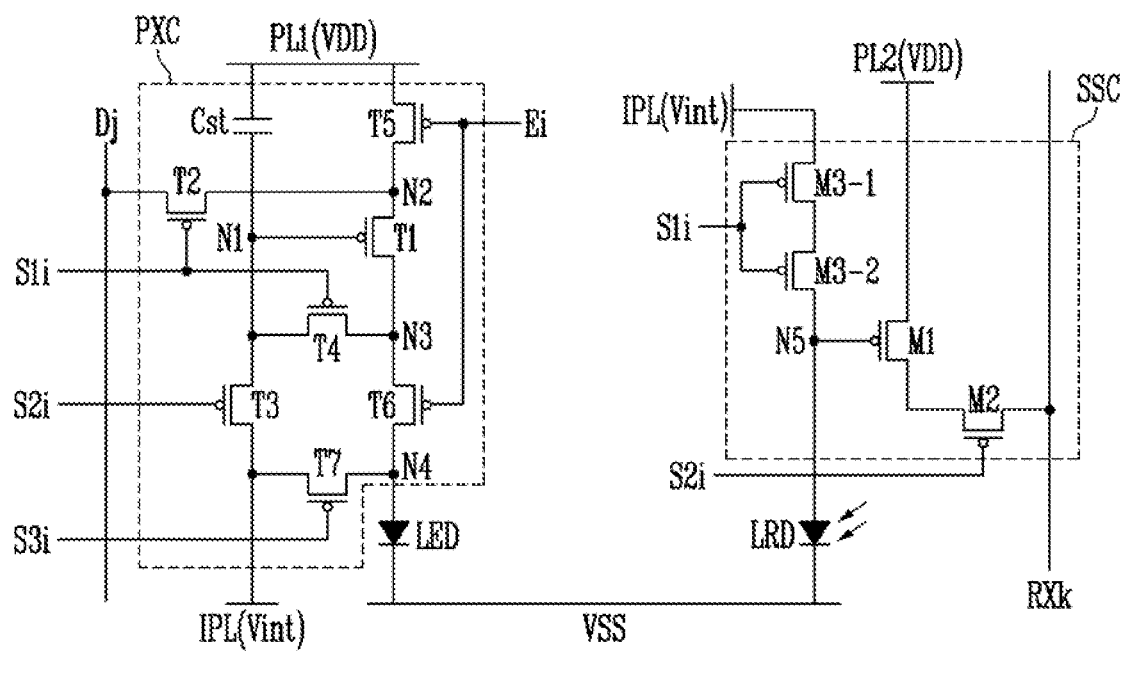
FIG. 3 is a circuit diagram illustrating an example of a pixel and a photo sensor, which are included in the display area shown in FIG. 2.

FIG. 3 is a circuit diagram illustrating an example of a pixel and a photo sensor, which are included in the display area shown in FIG. 2.

In FIG. 3, for convenience of description, there are illustrated a pixel PX which is located on an ith pixel row (or ith horizontal line) and is connected to a jth data line Dj and a photo sensor PHS which is located on the ith pixel row and is connected to a kth readout line RXk (i, j, and k are natural numbers).

Pixel circuits of the first to fourth pixels PX1, PX2, PX3, and PX4 may be configured substantially identically. Sensor circuits of the first and second photo sensors PHS1 and PHS2 may be configured substantially identically.

Referring to FIGS. 2 and 3, the pixel PX may include a pixel circuit PXC and a light emitting element LED connected thereto, and the photo sensor PHS may include a sensor circuit SSC and a light receiving element LRD connected thereto.

A first electrode (or first pixel electrode) of the light emitting element LED may be connected to a fourth node N4, and a second electrode (or second pixel electrode) of the light emitting element LED may be connected to a second power source VSS. The light emitting element LED may generate light with a predetermined luminance corresponding to an amount of current (or driving current) supplied from a first pixel transistor T1.

In an embodiment of the present disclosure, the light emitting element LED may be an organic light emitting diode including an organic light emitting layer. In another embodiment of the present disclosure, the light emitting element LED may be a light emitting element made of a combination of an inorganic material and an organic material.

A first electrode (or first sensor electrode) of the light receiving element LRD may be connected to a fifth node N5, and a second electrode (or second sensor electrode) of the light receiving element LRD may be connected to the second power source VSS. The light receiving element LRD may generate a carrier including free electrons and holes, based on the intensity of light incident into a light receiving layer, and generate a current (or photocurrent) caused by movement of the carrier.

The pixel circuit PXC may include the first pixel transistor T1, a second pixel transistor T2, a storage capacitor Cst, and the light emitting element LED. In an embodiment of the present disclosure, the pixel circuit PXC may further include third, fourth, fifth, sixth and seventh transistors T3, T4, T5, T6 and T7.

The first pixel transistor T1 (or driving transistor) may be connected between a first power line PL1 to which a voltage of a first power source VDD is applied and the first electrode of the light emitting element LED. The first pixel transistor T1 may include a gate electrode connected to a first node N1.

The first pixel transistor T1 may control an amount of current (e.g., a driving current) flowing from the first power source VDD to the second power source VSS via the light emitting element LED, based on a voltage of the first node N1. To accomplish this, the first power source VDD may be set to a voltage higher than that of the second power source VSS.

The second pixel transistor T2 may be connected between a jth data line Dj (hereinafter, referred to as a data line) and a second node N2. A gate electrode of the second pixel transistor T2 may be connected to an ith first scan line S1i (hereinafter, referred to as a first scan line). The second pixel transistor T2 may be turned on when a first scan signal is supplied to the first scan line S1i, to electrically connect the data line Dj and the second node N2 to each other.

The third pixel transistor T3 may be connected between the first node N1 and an initialization power line IPL for transferring a voltage of an initialization power source Vint. A gate electrode of the third pixel transistor T3 may be connected to an ith second scan line S2i (hereinafter, referred to as a second scan line). The third pixel transistor T3 may be turned on by a second scan signal supplied to the second scan line S2i. When the third pixel transistor T3 is turned on, the voltage of the initialization power source Vint may be supplied to the first node N1 (e.g., the gate electrode of the first pixel transistor T1).

The fourth pixel transistor T4 may be connected between the first node N1 and a third node N3. A gate electrode of the fourth pixel transistor T4 may be connected to the first scan line S1i. The gate electrode of the fourth pixel transistor T4 may also be connected to the gate electrode of the second pixel transistor T2. The fourth pixel transistor T4 may be simultaneously turned on with the second pixel transistor T2.

The fifth transistor T5 may be connected between the first power line PL1 and the second node N2. A gate electrode of the fifth pixel transistor T5 may be connected to an ith emission control line Ei (hereinafter, referred to as an emission control line). The sixth pixel transistor T6 may be connected between the third node N3 and the light emitting element LED (or the fourth node N4). A gate electrode of the sixth pixel transistor T6 may be connected to the emission control line Ei. The gate electrode of the sixth pixel transistor T6 may be connected to the gate electrode of the fifth pixel transistor T5. The fifth pixel transistor T5 and the sixth pixel transistor T6 may be turned on when an emission control signal is supplied to the emission control line Eli, and be turned off in other cases.

In some embodiments of the present disclosure, when the fifth and sixth pixel transistors T5 and T6 are turned on, a current flowing through the first pixel transistor T1 may be transferred to the light emitting element LED, and the light emitting element LED may emit light.

The seventh pixel transistor T7 may be connected between the first electrode of the light emitting element LED (e.g., the fourth node N4) and the initialization power line IPL. A gate electrode of the seventh pixel transistor T7 may be connected to an ith third scan line S3i (hereinafter, referred to as a third scan line). The seventh pixel transistor T7 may be turned on by a third scan signal supplied to the third scan line S3i, to supply the voltage of the initialization power source Vint to the first electrode of the light emitting element LED.

The storage capacitor Cst may be connected between the first power line PL1 and the first node N1.

In an embodiment of the present disclosure, the first scan signal and the second scan signal may be supplied at different timings. In other words, the first scan signal may be supplied after the second scan signal is supplied. For example, the second scan signal and the first scan signal may be supplied with a difference of one horizontal period.

In an embodiment of the present disclosure, the third scan signal may be supplied after the first scan signal is supplied. For example, the supply interval of the third scan signal and the first scan signal may be one horizontal period. In addition, the third scan signal may be supplied after the second scan signal is supplied. However, this is merely an example, and the third scan signal may be supplied simultaneously with the second scan signal. The third scan line S3i and the second scan line S2i may be connected to each other.

Alternatively, the third scan signal may be supplied simultaneously with the first scan signal. The third scan line S3i may be connected to the first scan line S1i.

The sensor circuit SSC may include a first sensor transistor M1, a second sensor transistor M2 and a third sensor transistor M3.

The first sensor transistor M1 and the second sensor transistor M2 may be connected in series between a second power line PL2 and the kth readout line RXk (hereinafter, referred to as a readout line).

A gate electrode of the first sensor transistor M1 may be connected to the fifth node N5 (or the first electrode (e.g., first sensor electrode) of the light receiving element LRD). The first sensor transistor M1 may generate a sensing current flowing from the second power line PL2 to the readout line. RXk, based on a voltage of the fifth node N5, which is caused by the photocurrent generated by the light receiving element LRD.

A gate electrode of the second sensor transistor M2 may be connected to the second scan line S2i. The second sensor transistor M2 may be turned on when the second scan signal is supplied to the second scan line S2i, to electrically connect to the first sensor transistor M1 and the readout line RXk to each other. In this case, a sensing signal (e.g., a sensing current) nay be supplied to the sensor driver 220 through the readout line RXk.

In an embodiment of the present disclosure, the gate electrode of the second sensor transistor M2 and the gate electrode of the third pixel transistor T3 may share the same second scan line S2i. For example, the gate electrode of the second sensor transistor M2 and the gate electrode of the third pixel transistor T3 may be connected to one second scan line S2i.

The third sensor transistor M3 may be connected between the initialization power line IPL and the fifth node N5. A gate electrode of the third sensor transistor M3 may be the first scan line S1i. In other words, the third sensor transistor M3 may be connected to the initialization power line IPL and the first sensor transistor M1. The third sensor transistor M3 may be turned on by the first scan signal, to supply the voltage of the initialization power source Vint to the fifth node N5. The third sensor transistor M3 may be used for voltage reset (or initialization) of the fifth node N5. For example, one electrode of the third sensor transistor M3, one electrode of the third pixel transistor T3, and one electrode of the seventh pixel transistor T7 may be commonly connected to the initialization power source Vint.

In an embodiment of the present disclosure, the first scan line S1i may be commonly connected to the gate electrode of the third sensor transistor M3 and the gate electrode of the second pixel transistor T2.

In an embodiment of the present disclosure, the third sensor transistor M3 may include a plurality of sub-transistors M3-1 and M3-2 connected in series.

The first to seventh pixel transistors T1 to T7 and the first to third sensor transistors M1 to M3 may be implemented with a P-type transistor (e.g., a p-type metal oxide semiconductor (PMOS) transistor), but the present disclosure is not limited thereto. For example, at least one of the first to seventh pixel transistors T1 to T7 and the first to third sensor transistors M1 to M3 may be implemented with an N-type transistor (e.g., an (NMOS) transistor).

Figure 4:
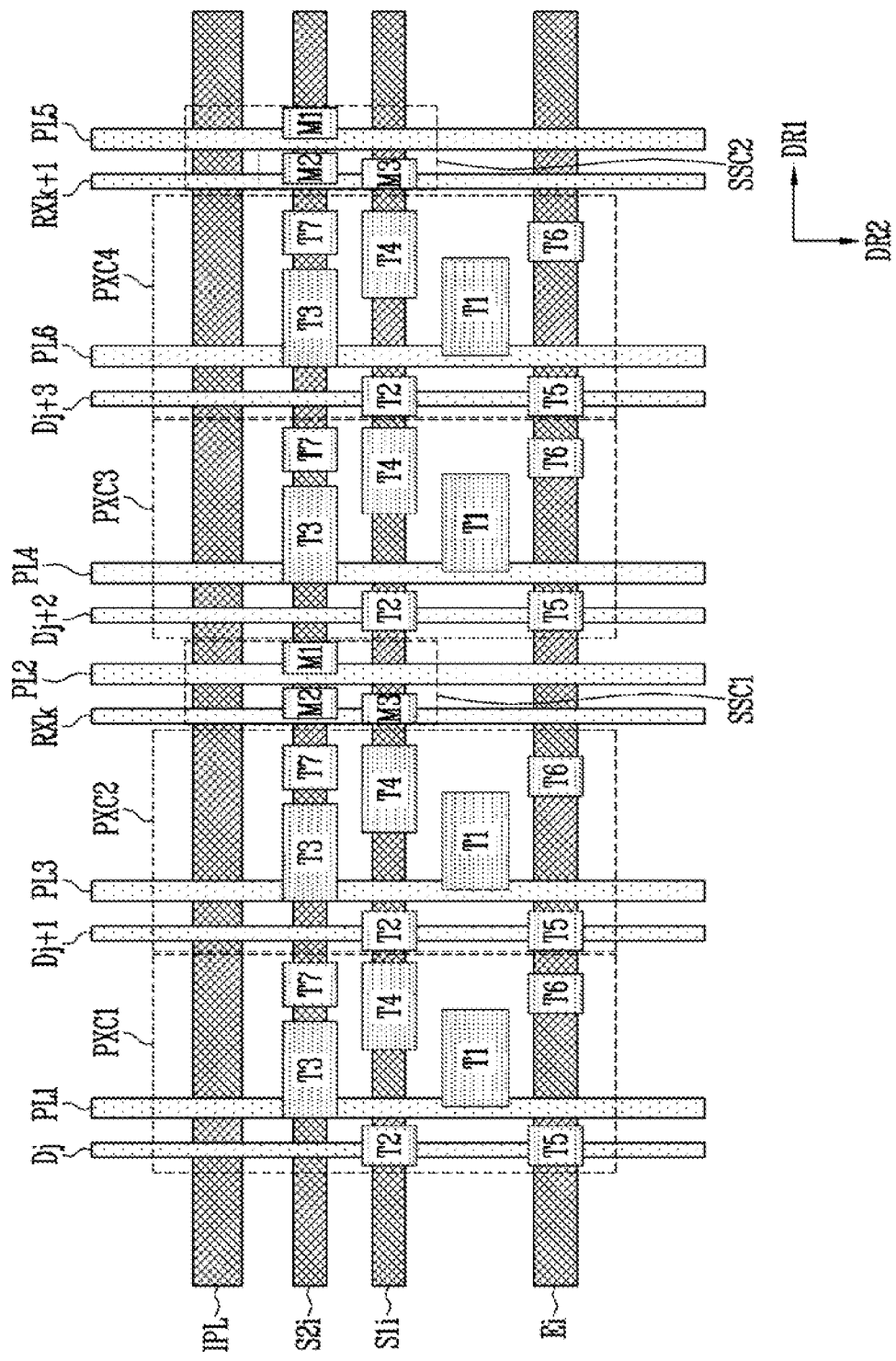
FIG. 4 is a view illustrating an example of lines and transistors, which constitute the pixel and the photo sensor, which are shown in FIG. 3.

FIG. 4 is a view illustrating an example of the lines and the transistors, which constitute the pixel and the photo sensor, which are shown in FIG. 3.

FIG. 4 illustrates the first to seventh pixel transistors T1 to T7 and the first to third sensor transistors M1 to M3, which are included in the ith pixel row, and lines passing through the ith pixel row. For convenience of description, FIG. 4 illustrates a position relationship of transistors and signal lines (e.g., scan lines, an emission control line, and the like), which constitute a backplane structure. It is to be understood, however, that the present disclosure is not limited to a vertical stacking relationship and a connection relationship of the signal lines and the transistors.

Referring to FIGS. 1, 2, 3, and 4, in a backplane structure of the display panel 100, the ith pixel row may include a plurality of pixel circuits PXC1, PXC2, PXC3 and PXC4 and a plurality of sensor circuits SSC1 and SSC2.

The initialization power line IPL, the first scan line S1i, the second scan line S2i, and the emission control line Ei may extend in the first direction DR1. The initialization power line IPL, the first scan line S1i, the second scan line S2i, and the emission control line Ei may be spaced apart from each other in the second direction DR2. The initialization power line IPL, the first scan line S1i, the second scan line S2i, and the emission control line Ei may be parallel to each other in the first direction DR1. In an embodiment of the present disclosure, the gate electrode of the third pixel transistor T3 and the gate electrode of the fourth pixel transistor T4 may be commonly connected to the second scan line S2i. Far example, the third scan line S3i shown in FIG. 3 may be replaced with the second scan line S2i.

In an area including the ith pixel row of the display area AA, data lines Dj, Dj+1, Dj+2, and Dj+3, power lines PL1, PL2, PL3, PL4, PL5, and PL6, and readout lines RXk and RXk+1 may extend in the second direction DR2. The power lines PL1, PL2, PL3, PL4, PL5, and PL6 are lines for supplying the voltage of the first power source VDD. On the ith pixel row, first to sixth power lines PL1 to PL6 may be spaced apart from each other in the first direction DR1, and each extend in the second direction DR2.

Each of first to fourth pixel circuits PXC1, PXC2, PXC3, and PXC4 may include first to seventh pixel transistors T1 to T7. The first pixel circuit PXC1 may be included in the first pixel PX1, and be connected to a jth data line Dj and a first power line PL1. The second pixel circuit PXC2 may be included in the second pixel PX2, and be connected to a (j+1)th data line Dj+1 and a third power line PL3. The third pixel circuit PXC3 may be included in the third pixel PX3, and be connected to a (j+2)th data line Dj+2 and a fourth power line PL4. The fourth pixel circuit PXC4 may be included in the fourth pixel PX4, and be connected to a (j+3)th data line Dj+3 and a sixth power line PL6.

Each of first and second sensor circuits SSC1 and SSC2 may include first to third sensor transistors M1 to M3. The first sensor circuit SSC1 may be included in the first photo sensor PHS1, and be connected to a kth readout line RXk and a second power line PL2. The first sensor circuit SSC1 may be located between the second and third pixel circuits PXC2 and PXC3. The second sensor circuit SSC2 may be included in the second photo sensor PHS2, and be connected to a (k+1)th readout line RXk+1 and a fifth power line PL5. The second sensor circuit SSC2 may be located between the fourth pixel circuit PXC4 and another first pixel circuit PXC1.

As described'above, the first to sixth power lines PL1 to PL6 for transferring the voltage of the first power source VDD may be separated from each other to be respectively connected to the first to fourth pixel circuits PXC1 to PXC4 and the first and second sensor circuits SSC1 and SSC2. For example, the first power line PL1 may be connected to the first pixel circuit PXC1 and the second power line PL2 may be connected to the first sensor circuit SSC1.

In an embodiment of the present disclosure, the first sensor circuit SSC1 may be disposed between the second pixel circuit PXC2 and the third pixel circuit PXC3. In addition, the second sensor transistor M2 may overlap the second scan line S2i, and the third sensor transistor M3 may overlap the first scan line S1i. In addition, the kth readout line RXk and the second power line PL2 may be disposed between the (j+1)th data line Dj+1 and the (j+2)th data line Dj+2.

As shown in FIGS. 3 and 4, gate electrodes of the third pixel transistors T3, gate electrodes of the seventh pixel transistors T7, and gate electrodes of the second sensor transistors M2 may be commonly connected to the second scan line S2i. Gate electrodes of the second pixel transistors T2, gate electrodes of the fourth pixel transistors T4, and gate electrodes of the third sensor transistors M3 may be commonly connected to the first scan line S1i. In addition, one electrode (e.g., drain electrodes) of each of the third pixel transistors T3, one electrode (e.g., drain electrodes) of each of the seventh pixel transistors T7, and one electrode (e.g., source electrodes) of each of the third sensor transistor M3 may be commonly connected to the initialization power line IPL.

As described above, the first to fourth pixel circuits PXC1 to PXC4 and the first and second sensor circuits SSC1 and SSC2 of the ith pixel row share the initialization power line IPL, the first scan line S1i, and the second scan line S2i, so that the complexity of the lines of the backplane structure of the display area AA, interference between conductive patterns (e.g., lines), connection weakness, and the like can be reduced.

Figure 5:
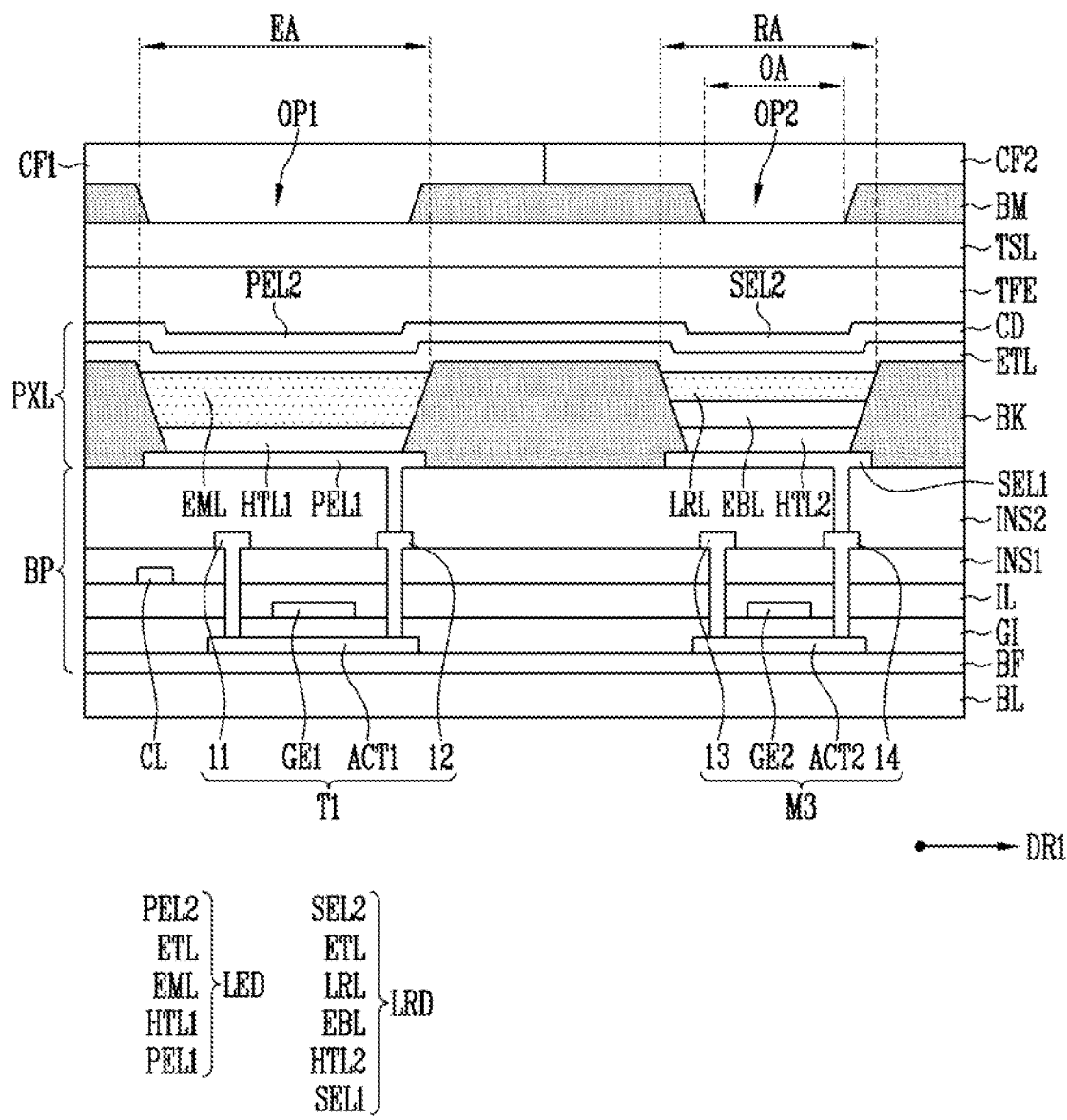
FIG. 5 is a sectional view illustrating an example of the display area shown in FIG. 2.
Figure 6:
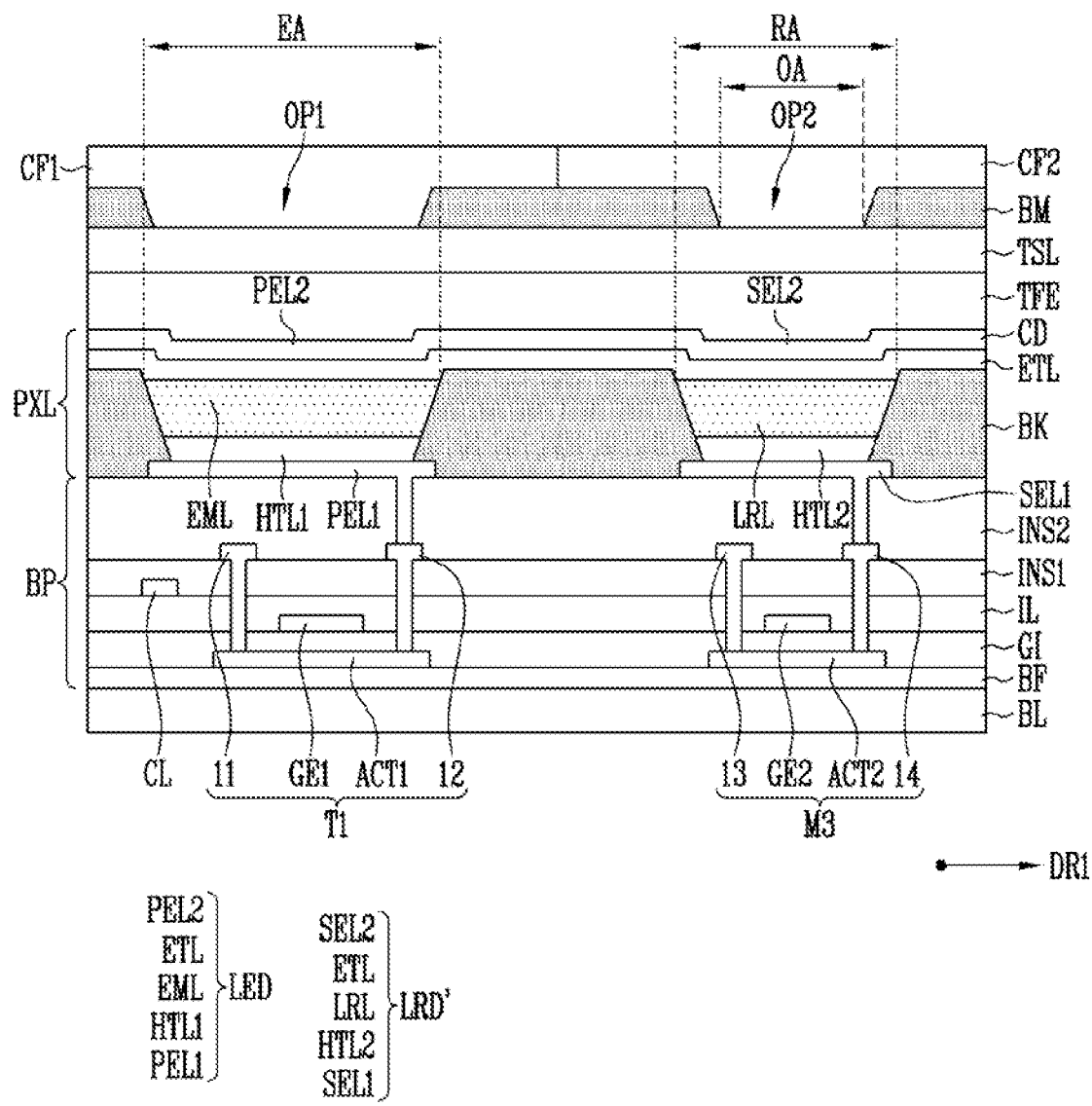
FIG. 6 is a sectional view illustrating another example of the display area shown in FIG. 2.

FIG. 5 is a sectional view illustrating an example of the display area shown in FIG. 2. FIG. 6 is a sectional view illustrating another example of the display area shown in FIG. 2.

Referring to FIGS. 1, 2, 3, 4, 5, and 6, the display panel 100 of the display device 1000 may include a base layer BL, a backplane structure BP, a pixel layer PXL, an encapsulation layer TFE, a touch sensor layer TSL, a black matrix BM, and color filters CF1 and CF2. The black matrix BM may form an optical system for transferring light to a light receiving element LRD.

The sectional views shown in FIGS. 5 and 6 illustrate a partial configuration of the pixel PX and the photo sensor PHS.

The base layer BL may be made of an insulative material such as glass or resin. The base layer BL may be made of a material having flexibility to be bendable or foldable, and have a single- or multi-layered structure.

The backplane structure BP including the pixel circuit PXC and the sensor circuit SSC may be provided on the base layer BL. The backplane structure BP may include a semiconductor layer, a plurality of conductive layers, and a plurality of insulating layers, which will be described later.

The buffer layer BF may be formed on the base layer BL. The buffer layer BF may prevent an impurity from being diffused into transistors T1 and M3 (e.g., the first pixel transistor and the third sensor transistor). The buffer layer BF may be omitted depending on the material and process conditions of the base layer BL.

A first active pattern ACT1 and a second active pattern ACT2 may be provided on the buffer layer BF. The first active pattern ACT1 and the second active pattern ACT2 may be formed of a semiconductor material. Each of the first active pattern ACT1 and the second active pattern ACT2 may include a source region, a drain region, and a channel region provided between the source region and the drain region.

A gate insulating layer GI nay be provided over the first active pattern ACT1 and the second active pattern ACT2. The gate insulating layer GI may be an inorganic insulating layer made of an inorganic material.

A first gate electrode GE1 and a second gate electrode GE2 may be provided on the gate insulating layer GI. The first gate electrode GE1 is formed to cover a region corresponding to the channel region of the first active pattern ACT1. In other words, first gate electrode GE1 may overlap a portion of the first active pattern ACT1. The second gate electrode GE2 is formed to cover a region corresponding to the channel region of the second active pattern ACT2. In other words, second gate electrode GE2 may overlap a portion of the second active pattern ACT2.

The first gate electrode GE1 and the second gate electrode GE2 may be made of a metal. For example, the first gate electrode GE1 and the second gate electrode GE2 may be made of at least one of metals such as gold (Au), silver (Ag), aluminum (Al), molybdenum (Mo), chromium (Cr), titanium (Ti), nickel (Ni), neodymium (Nd), and copper (Cu), or alloys thereof. In addition, each of the first gate electrode GE1 and the second gate electrode GE2 may be formed as a single layer or a multi-layer in which two or more of the metals and the alloys are stacked.

An interlayer insulating layer IL may be provided over the first gate electrode GE1 and the second gate electrode GE2. The interlayer insulating layer IL may be an inorganic insulating layer made of an inorganic material. The inorganic material may include polysiloxane, silicon nitride, silicon oxide, silicon oxynitride, etc.

A conductive layer CL may be provided on the interlayer insulating layer IL. The conductive layer CL may form at least one of one electrode of the storage capacitor Cst, the first to third scan lines S1i, S2i, and S3i, the data line Dj, the first and second power lines PL1 and PL2, the readout line RXk, and the initialization power line IPL. The conductive layer CL may be made of at least one of metals such as gold (Au), silver (Ag), aluminum (Al), molybdenum (Mo), chromium (Cr), titanium (Ti), nickel (Ni), neodymium (Nd), and copper (Cu), or alloys thereof. In addition, the conductive layer CL may be formed as a single layer. However, the present disclosure is not limited thereto, and the conductive layer CL may be formed as a single layer or a multi-layer in which two or more of the metals and the alloys are stacked.

A first insulating layer INS1 may be provided over the conductive layer CL. The first insulating layer INS may be an inorganic insulating layer made of an inorganic material. The inorganic material may include polysiloxane, silicon nitride, silicon oxide, silicon oxynitride, etc.

A first source electrode 11, a first drain electrode 12, a second source electrode 13, and a second drain electrode 14 may be provided on the first insulating layer INS1. Although a case where the first pixel transistor T1 and the third sensor transistor M3 are implemented as a P-type transistor is illustrated in FIG. 5, the source and drain electrodes may be changed according to types of the transistors.

The first source electrode 11 and the first drain electrode 12 may be respectively in contact with the source region and the drain region of the first active pattern ACT1 through contact holes formed in the first insulating layer INS1, the interlayer insulating layer IL, and the gate insulating layer GI. The first source electrode 11, the first drain electrode 12, the first gate electrode GE1, and the first active pattern ACT1 may constitute the first pixel transistor T1.

The second source electrode 13 and the second drain electrode 14 may be respectively in contact with the source region and the drain region of the second active pattern ACT2 through contact holes formed in the first insulating layer INS1 the interlayer insulating layer IL, and the gate insulating layer GI. The second source electrode 13, the second drain electrode 14, the second gate electrode GE2, and the second active pattern ACT2 may constitute the third sensor transistor M3.

The first and second source electrodes 11 and 13 and the first and second drain electrodes 12 and 14 may be made of a metal. For example, the first and second source electrodes 11 and 13 and the first and second drain electrodes 12 and 14 may be made of at least one of metals such as gold (Au), silver (Ag), aluminum (Al), molybdenum (Mo), chromium (Cr), titanium (Ti), nickel (Ni), neodymium (Nd), and copper (Cu), or alloys thereof.

In an embodiment of the present disclosure, a passivation layer may be provided over the first and second source electrodes 11 and 13 and the first and second drain electrodes 12 and 14. The passivation layer may be an inorganic insulating layer made of an inorganic material. The inorganic material may include polysiloxane, silicon nitride, silicon oxide, silicon oxynitride, etc.

A second insulating layer INS2 may be provided over the first and second source electrodes 11 and 13 and the first and second drain electrodes 12 and 14 (or the passivation layer). In an embodiment of the present disclosure, the second insulating layer INS2 may be an organic insulating layer made of an organic material. The organic material may include an organic insulating material such as a polyacryl-based compound, a polyimide-based compound, a fluorine-based compound such as Teflon, or a benzocyclobutene-based compound. The second insulating layer INS2 may be an inorganic insulating layer made of an inorganic material.

Although a case where the second insulating layer INS2 is provided on the first insulating layer INS1 is illustrated in FIG. 5, the arrangement of the insulating layers may be changed. For example, only one passivation layer may be provided over the first and second source and drain electrodes 11, 12, 13, and 14, and a first pixel electrode PEL1 and a first sensor electrode SEL1 may be provided on the passivation layer. Alternatively, an additional conductive layer and a third insulating layer covering the same may be provided on the second insulating layer INS2, and the first pixel electrode PEL1 and the first sensor electrode SEL1 may be formed on the third insulating layer.

The pixel layer PXL may be provided on the backplane structure BP. The pixel layer PXL may include a light emitting element LED connected to the first pixel circuit PXC1 and a light receiving element LRD connected to the first sensor circuit SSC1.

In an embodiment of the present disclosure, the light emitting element LED may include the first pixel electrode PEL1, a first hole transport layer HTL1, a light emitting layer EML, an electron transport layer ETL, and a second pixel electrode PEL2. In an embodiment of the present disclosure, the light receiving element LRD may include the first sensor electrode SEL1, a second hole transport layer HTL2, an electron blocking layer EBL, a light receiving layer LRL, the electron transport layer ETL, and a second sensor electrode SEL2.

In an embodiment of the present disclosure, the first pixel electrode PEL1 and the first sensor electrode SEL1 may be made of a metal such as Ag, Mg, Al, Pt, Pd, Au, Ni, Nd, Ir, Cr, or any alloy thereof, and/or indium tin oxide (ITO), indium zinc oxide (IZO), zinc oxide (ZnO), indium tin zinc oxide (ITZO), etc. The first pixel electrode PEL1 may be connected to the first drain electrode 12 through a contact hole. The first sensor electrode SEL1 may be connected to the second drain electrode 14 through a contact hole.

The first pixel electrode PEL1 and the first sensor electrode SEL1 may be simultaneously formed through patterning using a mask. The first pixel electrode PEL1 and the first sensor electrode SEL1 may be formed at the same layer. For example, each of the first pixel electrode PEL1 and the first sensor electrode SEL1 may be disposed directly on the second insulating layer INS2.

A bank layer BK (or pixel defining layer) defining a light emitting area EA and a light receiving area RA may be provided on the second insulating layer INS2 on which the first pixel electrode PEL1 and the first sensor electrode SEL1 are formed. The bank layer BK may overlap portions of the first pixel electrode PEL1 and the first sensor electrode SEL1. The bank layer BK may be an organic insulating layer made of an organic material. The organic material may include acryl resin, epoxy resin, phenolic resin, polyamide resin, polyimide resin, etc.

In addition, the bank layer BK may include a light absorption material or have a light absorber coated thereon, to absorb light introduced from the outside. For example, the bank layer BK may include a carbon-based black pigment. However, the present disclosure is not limited thereto. The bank layer BK may include an opaque metal material such as chromium (Cr), molybdenum (Mo), an alloy (MoTi) of molybdenum and titanium, tungsten (W), vanadium (V), niobium (Nb), tantalum (Ta), manganese (Mn), cobalt (Co) or nickel (Ni), which has a high light absorption rate.

The bank layer BK may expose a top surface of the first pixel electrode PEL1 and a top surface of the first sensor electrode SEL1, and protrude from the second insulating layer INS2 along the circumference of the light emitting area EA and the circumference of the light receiving area RA. In other words, the bank layer BK may include openings corresponding to the light emitting area EA and the light receiving area RA. As shown in FIG. 5, the opening of the bank layer BK corresponding to the light emitting area EA is larger than the opening of the bank layer BK corresponding to the light receiving area RA. However, the present disclosure is not limited thereto and the openings may be the same size as each other, for example.

The first hole transport layer HTL1 may be provided on the top surface of the first pixel electrode PEL1, which is exposed by the bank layer BK, and the second hole transport layer HTL2 may be provided on the top surface of the first sensor electrode SEL1, which is exposed by the bank layer BK. Holes may be moved to the light emitting layer EML through the first hole transport layer HTL1, and holes may be moved to the light receiving layer LRL through the second hole transport layer HTL2.

In an embodiment of the present disclosure, the first hole transport layer HTL1 and the second hole transport layer HTL2 may be the same or be different from each other according to materials of the light emitting layer EML and the light receiving layer LRL.

The light emitting layer EML may be provided on the first hole transport layer HTL1 in the light emitting area ES surrounded by the bank layer BK. In an embodiment of the present disclosure, the light emitting layer EML may be configured as an organic light emitting layer. The light emitting layer EML may emit light such as red light, green light, or blue light according to an organic material included in the light emitting layer EML.

In an embodiment of the present disclosure, as shown in FIG. 5, the electron blocking layer EBL may be provided on the second hole transport layer HTL2 in the light receiving area RA surrounded by the bank layer BK. The electron blocking layer EBL may block charges of the light receiving layer LRL from being moved to the second hole transport layer HTL2. In an embodiment of the present disclosure, the electron blocking layer EBL may include the same material as the first hole transport layer HTL1 of the light emitting area EA. In FIG. 5, the light receiving layer LRL may have the same thickness as the electron blocking layer EBL.

In an embodiment of the present disclosure, as shown in FIG. 6 (shown as LRD'), the electron blocking layer EBL may be omitted. In this case, the light receiving layer LRL may have the same thickness as the light emitting layer EML.

The light receiving layer LRL may be disposed on the electron blocking layer EBL or the second hole transport layer HTL2. The light receiving layer LRL may emit electrons, corresponding to light of a specific wavelength band, to sense an intensity of the light.

In an embodiment of the present disclosure, the light receiving layer LRL may include a low molecular organic material. For example, the light receiving layer LRL may be made of a phthalocyanine compound including at least one metal selected from the group consisting of copper (Cu), iron (Fe), nickel (Ni), cobalt (Co), manganese Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn).

Alternatively, the low molecular organic material included in the light receiving layer LRL may have a bi-layered structure including a layer comprising a layer including a phthalocyanine compound including at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn), and a layer including C60. Alternatively, the low molecular organic material included in the light receiving layer LRL may have a single-layered structure in which a phthalocyanine compound and C60 are mixed.

However, this is merely an example, and the light receiving layer LRL may include a high molecular organic layer.

In an embodiment of the present disclosure, the light receiving layer LRL may determine a light detection band by controlling the selection of a metal component included in the phthalocyanine compound. For example, the phthalocyanine compound including copper absorbs a visible light wavelength of a band of about 600 nm to about 800 nm. The phthalocyanine compound including tin (Sn) absorbs a near-infrared light wavelength of a band of about 800 nm to about 1000 nm. Therefore, the selection of a metal included in the phthalocyanine compound may be controlled, so that a photo sensor capable of detecting a wavelength of a band required by a user can be implemented. For example, the light receiving layer LRL may be formed to selectively absorb a wavelength of a red light band, a wavelength of a green light band, or a wavelength of a blue light band.

An area of the light receiving area RA may be smaller than that of the light emitting area EA. Thus, the existence of the light receiving area RA may barely influence light emission of the first to fourth pixels PX1 to PX4, and thus, an image quality of a certain level or more can be ensured. It is to be understood, however, that the area of the light receiving area RA may be larger than that of the light emitting area EA.

In an embodiment of the present disclosure, the electron transport layer ETL may be provided on the light emitting layer EML and the light receiving layer LRL. The electron transport layer ETL may be integrally formed on the display area AA. Therefore, the electron transport layer ETL may be in contact with a top surface of the bank layer BK in addition to being in contact with a top surface of the light emitting layer EML and the light receiving layer LRL.

However, this is merely an example, and at least one of the first hole transport layer HTL1, the second hole transport layer HTL2, the electron blocking layer EBL, and the electron transport layer ETL may be omitted. In addition, a functional layer such as a hole injection layer or an electron injection layer may be added.

The second pixel electrode PEL2 may be provided on the electron transport layer ETL of the light emitting area EA, and the second sensor electrode SEL2 may be provided on the electron transport layer ETL of the light emitting area EA. In an embodiment of the present disclosure, the second pixel electrode PEL2 and the second sensor electrode SEL2 may be a common electrode CD in which the second pixel electrode PEL2 and the second sensor electrode SEL2 are integrally formed on the display area AA. The voltage of the second power source VSS may be applied to second pixel electrode PEL2 and the second sensor electrode SEL2.

The second pixel electrode PEL2 and the second sensor electrode SEL2 may be configured as a metal layer such as Ag, Mg, Al, Pt, Pd, Au, Ni, Nd, Ir or Cr, and/or a transparent conductive layer such as ITO, IZO, ZnO or ITZO. In an embodiment of the present disclosure, the common electrode CD may be configured as a double-layer or multi layer including a metal thin film. For example, the common electrode CD may be configured as a triple-layer of ITO/Ag/ITO.

The encapsulation layer TFE may be provided on the common electrode CD including the second pixel electrode PEL2 and the second sensor electrode SEL2. The encapsulation layer TFE may be configured as a single layer or a multi-layer. In an embodiment of the present disclosure, the encapsulation layer TFE may have a stack structure in which an inorganic material, an organic material, and an inorganic material are sequentially stacked. An uppermost layer of the encapsulation layer TFE may be formed of an inorganic material.

In an embodiment of the present disclosure, the touch sensor layer TSL may be disposed on the encapsulation layer TFE. The touch sensor layer TSL may include a conductive pattern for touch sensing and an insulating layer. The conductive pattern of the touch sensor layer TSL may be configured as a single layer or a double-layer in which the conductive patterns are formed with the insulating layer interposed therebetween.

In an embodiment of the present disclosure, to ensure image quality and receiving light amount, the conductive pattern of the touch sensor layer TSL may be disposed while avoiding the light emitting area EA and the light receiving area RA. In other words, the conductive pattern of the touch sensor layer TSL may not be disposed in the light emitting area EA and the light receiving area RA.

The black matrix BM may be provided on the encapsulation layer TFE or the touch sensor layer TSL. The black matrix BM may overlap the bank layer BK. The black matrix BM may absorb or block light introduced from the outside. The black matrix BM may include an organic light blocking material. For example, the organic light blocking material may include at least one of carbon black (CB) and titan block (TiBK), but the present disclosure is not necessarily limited.

The black matrix BM may include a plurality of openings OP1 and OP2. In an embodiment of the present disclosure, the black matrix BM may be formed through a patterning process using a mask, a printing process, or the like.

The black matrix BM may cover the conductive pattern of the touch sensor layer TSL. The black matrix BM is disposed while avoiding the light emitting area EA. For example, the black matrix BM may be formed in a pattern form including a first opening OP1 overlapping with the light emitting area EA.

A second opening OP2 of the black matrix BM may overlap with the light receiving area RA. In an embodiment of the present disclosure, an area of an opening area OA corresponding to the second opening OP2 may be smaller than that of the light receiving area RA overlapping therewith. The opening area OA of the black matrix BM may be provided as an optical path through which external light is incident into the light receiving layer LRL.

For example, a vertical light component of the external light may be transferred to the light receiving layer LRL through the opening area OA of the second opening OP2. Alternatively, the phase of an image formed on the light receiving layer LRL via the opening area OA may be reversed by 180 degrees from the external light. However, this is merely an example, and a function of the opening area OA of the second opening OP2 as an optical system may be determined by a width of the second opening OP2, a thickness of the black matrix BM, a distance between the black matrix BM and the light receiving layer LRL, a distance between the black matrix BM and an upper structure (e.g., window or the like), etc. In other words, characteristics of the optical system may be changed by varying the width of the second opening OP2, the thickness of the black matrix BM, the distance between the black matrix BM and the light receiving layer LRL, the distance between the black matrix BM and an upper structure (e.g., window or the like), etc.

The color filters CF1 and CF2 may be disposed on the touch sensor layer TSL and the black matrix BM. A first color filter CF1 may be one of a red color filter, a green color filter, and a blue color filter according to a color of light emitted in the light emitting area EA. For example, when green light is output in the light emitting area EA, the first color filter CF1 may be the green color filter.

In an embodiment of the present disclosure, the color filters CF1 and CF2 may be in direct contact with at least a portion of top and side surfaces of the black matrix BM. For example, the color filters CF1 and CF2 may be disposed directly on the black matrix BM. Alternatively, any other material except an adhesive member for allowing the color filters CF1 and CF2 and the black matrix BM to be adhered to each other is not interposed between the color filters CF1 and CF2 and the black matrix BM.

The first color filter CF1 may allow light emitted from the light emitting element LED to selectively pass therethrough. When the black matrix BM and the color filters CF1 and CF2 are disposed on the touch sensor layer TSL, external reflection can be sufficiently prevented without any polarizing layer having a thickness of about 80 μm or more. In addition, since the first color filter CF1 has a transmittance higher than that of the polarizing layer, contrast and light efficiency can be improved.

In an embodiment of the present disclosure, a second color filter CF2 may be provided while overlapping with the light receiving area EA. The second color filter CF2 may be one of red color filter, green color filter, and a blue color filter according to a color of light sensed in the light receiving layer LRL. For example, the light receiving layer LRL absorbs light of a green wavelength band, the second color filter CF2 may be the green color filter. In other words, the second color filter CF2 may be set regardless of colors of lights emitted from adjacent pixels, e.g., PX1, PX2, PX3, and PX4.

The black matrix BM and the first and second color filters CF1 and CF2 may serve as an anti-reflection layer for blocking reflection of external light. The display panel 100 includes the black matrix BM and the first and second color filters CF1 and CF2, which serve as the anti-reflection layer, so that any separate polarizing layer is not included in the display panel 100. Accordingly, luminance degradation can be prevented, and the thickness of the display panel 100 can be minimized.

In addition, the light receiving element LRD is formed in the same layer as the light emitting element LED, so that the thickness of the display panel 100 can be further decreased. The amount of external light incident into the light receiving element LRD is increased, so that light sensing performance can be improved. Further, the first sensor circuit SSC1 is formed simultaneously in a manufacturing process of the first pixel circuit PXC1, and the light receiving element LRD is formed simultaneously in a manufacturing process of the light emitting element LED, so that process time and manufacturing process steps can be reduced.

An embodiment of the present disclosure provides a display device 1000 including: a base layer BL; a backplane structure BP provided on the base layer BL, the backplane structure BP including pixel circuits PXC and a sensor circuit SSC; a pixel layer PXL provided on the backplane structure BP, the pixel layer PXL including light emitting elements LED respectively connected to the pixel circuits PXC and a light receiving element LRD connected to the sensor circuit SSC; an encapsulation layer TFE covering the pixel layer PXL; a black matrix BM provided on the encapsulation layer TFE, wherein the black matrix BM includes openings OP1 and OP2 overlapping the light emitting elements LED and the light receiving element LRD; and a color filter CF1 and CF2 provided on the encapsulation layer TFE and covering the black matrix BM, wherein the light emitting elements LED include light emitting layers EML, the light receiving element LRD includes a light receiving layer LRL, and at least one of the openings OP1 and OP2 of the black matrix BM overlaps one of the light emitting layers EML and the light receiving layer LRL.

Figure 7:
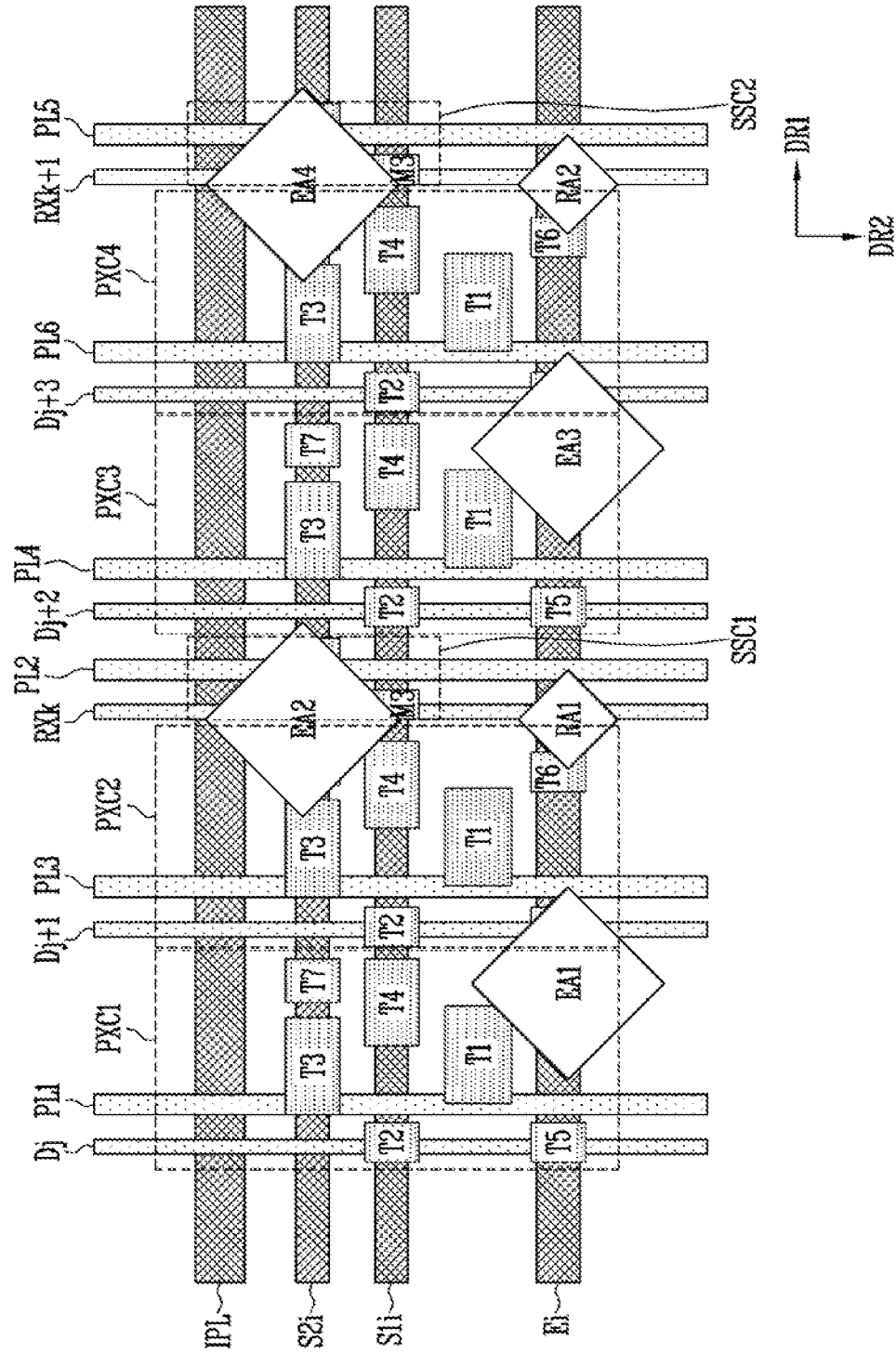
FIG. 7 is a view illustrating an example of lines, transistors, a light emitting area, and a light receiving area, which are included in the display area shown in FIG. 2.

FIG. 7 is a view illustrating an example of the lines, the transistors, the light emitting area, and the light receiving area, which are included in the display area shown in FIG. 2.

In FIG. 7, components identical to those described with reference FIG. 4 are designated by like reference numerals, and their redundant descriptions will be omitted.

Referring to FIGS. 1, 2, 3, 5, and 7, light emitting areas EA1, EA2, EA3 and EA4 corresponding to the light emitting elements LED and light receiving areas RA1 and RA2 corresponding to the light receiving element LRD may be formed on the backplane structure of the display panel 100.

A first light emitting area EA1 of the first pixel PX1 may overlap with a portion of the first pixel circuit PXC1 and a portion of the second pixel circuit PXC2. A portion of the first light emitting area EA1 overlapping the first pixel circuit PXC1 may be greater in size than a portion of the first light emitting area EA1 overlapping the second pixel circuit PXC2. A second light emitting area EA2 of the second pixel PX2 may overlap with a portion of the second pixel circuit PXC2 and a portion of the first sensor circuit SSC1. A third light emitting area EA3 of the third pixel PX3 may overlap with a portion of the third pixel circuit PXC3 and a portion of the fourth pixel circuit PXC4. A fourth light emitting area EA4 of the fourth pixel PX4 may overlap with a portion of the fourth pixel circuit PXC4 and a portion of the second sensor pixel SSC2.

In an embodiment of the present disclosure, a first light receiving area RA1 may overlap with a portion of the second pixel circuit PXC2, and a second light receiving area RA2 may overlap with a portion of the fourth pixel circuit PXC4. Distances between the first light receiving area RA1 and the first, second and third light emitting areas EA1, EA2, and EA3 adjacent thereto may be the same. For example, a distance along the emission control line Ei between the first light receiving area RA1 and the first light emitting area EA1 may be the same as a distance along the emission control line Ei between the first light receiving area RA1 and the third light emitting area EA3.

In addition, an area of the first light receiving area RA1 and an area of the second light receiving area RA2 may be smaller than those of the first to fourth light emitting areas EA1 to EA4.

Figure 8:
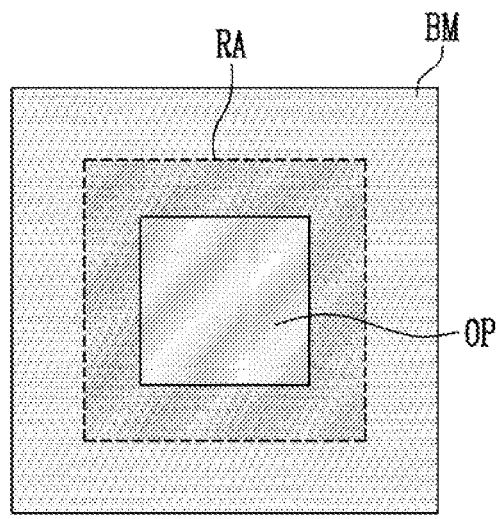
FIG. 8 is a plan view illustrating an example of an overlapping relationship between a black matrix and a light receiving layer in the display area shown in FIG. 5.
Figure 9:
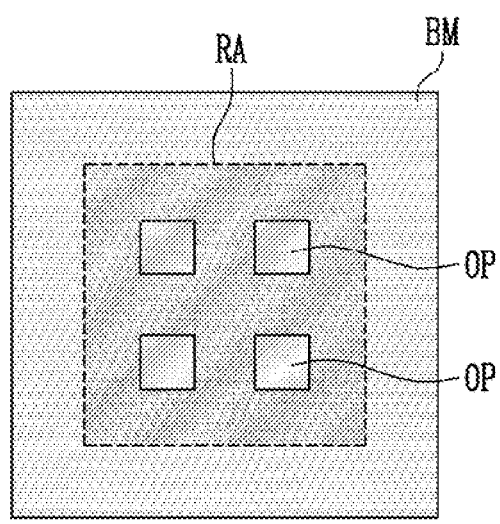
FIG. 9 is a plan view illustrating another example of the overlapping relationship between the black matrix and the light receiving layer in the display area shown in FIG. 5.

FIG. 8 is a plan view illustrating an example of an overlapping relationship between the black matrix and the light receiving layer in the display area shown in FIG. 5. FIG. 9 is a plan view illustrating another example of the overlapping relationship between the black matrix and the light receiving layer in the display area shown in FIG. 5.

Referring to FIGS. 5, 7, 8, and 9, the light receiving area RA and an opening OP of the black matrix BM may overlap with each other.

In an embodiment of the present disclosure, an area of the opening OP of the black matrix BM, which overlaps with the light receiving area RA, may be smaller than that of the light receiving area RA. Therefore, the opening OP of the black matrix BM may provide an optical path through which external light is incident into the light receiving layer LRL, and serve as an optical system. For example, the area of the opening OP may be equal to or smaller than about 75% of the area of the light receiving area RA. However, this is merely an example, and the area ratio is not limited thereto.

On the other hand, an area of the opening (OP1 shown in FIG. 6) of the black matrix BM, which overlaps with the light emitting area EA, may be equal to that of the light emitting area EA or be wider than that of the light emitting area EA. In other words, as described with reference to FIG. 7, the areas of the first to fourth light emitting areas EA1 to EA4 are wider than those of the first and second light receiving areas RA1 and RA2, and hence the area of the first opening OP1 shown in FIG. 6 is wider than that of the second opening OP2.

In an embodiment of the present disclosure, the opening OP of the black matrix BM may have a quadrangular planar shape. However, this is merely an example, and the planar shape of the opening OP may have various shape such as a circular shape, an elliptical shape, and a polygonal shape.

In an embodiment of the present disclosure, as shown in FIG. 8, the opening OP of the black matrix BM may correspond one-to-one to the light receiving area RA.

In another embodiment of the present disclosure, as shown in FIG. 9, a plurality of openings OP of the black matrix OP may overlap with the light receiving area RA. A total area of the openings OP shown in FIG. 9 may be equal to or smaller than 75% of the area of the light receiving area RA.

Figure 10:
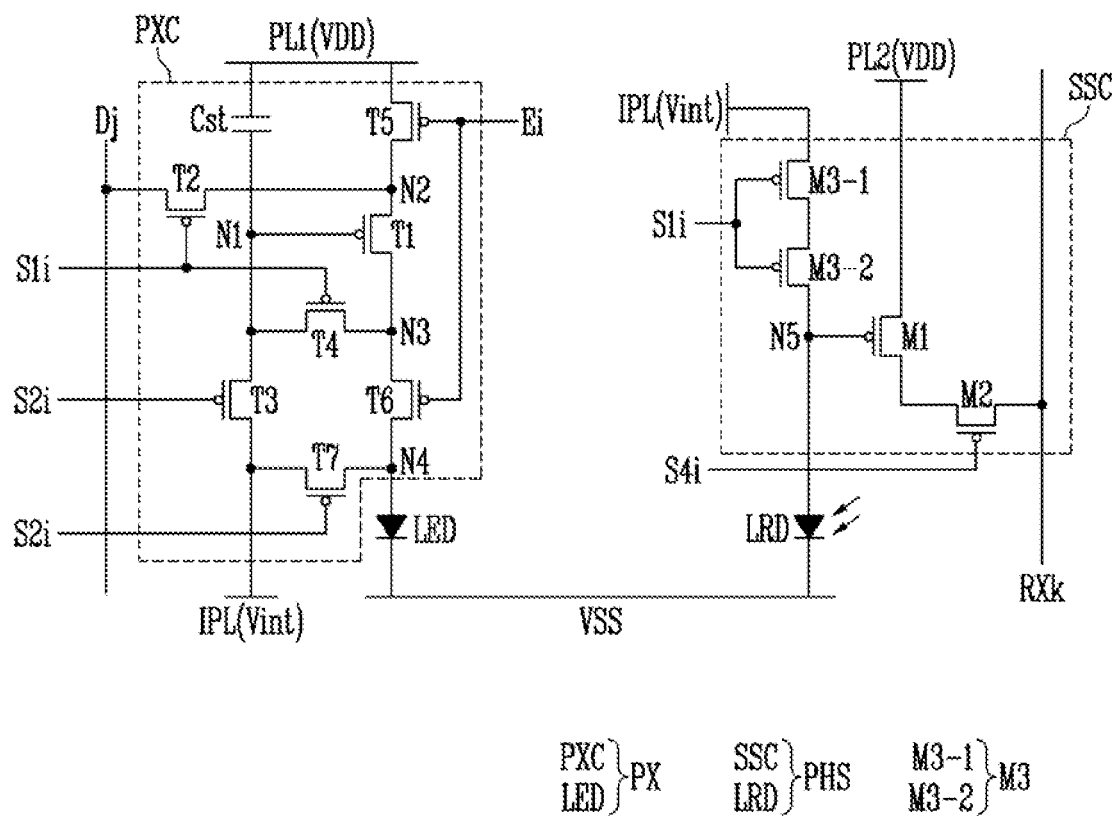
FIG. 10 is a circuit diagram illustrating another example of the pixel and the photo sensor, which are included in the display area shown in FIG. 2.

FIG. 10 is a circuit diagram illustrating another example of the pixel and the photo sensor, which are included in the display area shown in FIG. 2.

In FIG. 10, components identical to those described with reference to FIG. 3 are designated by like reference numerals, and their duplicate descriptions may be omitted. In addition, a circuit shown in FIG. 10 has a configuration substantially identical or similar to that of the circuit structure shown in FIG. 3, except for a second sensor transistor M2 and a fourth scan line S4i.

Referring to FIGS. 2 and 10, the pixel PX may include a pixel circuit PXC and a light emitting element LED connected thereto, and the photo sensor PHS may include a sensor circuit SSC and a light receiving element LRD connected thereto.

The pixel circuit PXC may include first to seventh pixel transistors T1 to T7 and a storage capacitor Cst. In an embodiment of the present disclosure, a gate electrode of the seventh pixel transistor T7 and a gate electrode of the third pixel transistor T3 may be commonly connected to the second scan line S2i. In FIG. 3, the gate electrode of the seventh pixel transistor T7 was connected to the third scan line S3i.

The sensor circuit SSC may include first to third sensor transistors M1 to M3. In an embodiment of the present disclosure, a gate electrode of the second sensor transistor M2 may be connected to an ith fourth scan line S4i (hereinafter, referred to as a fourth scan line). A fourth scan signal may be supplied to the gate electrode of the second sensor transistor M2 through the fourth scan line S4i. In other words, the second scan signal supplied to the gate electrode of the third pixel transistor T3 and the fourth scan signal supplied to the gate electrode of the second sensor transistor M2 may be controlled differently from each other.

In a normal mode in which a normal image is displayed, the first scan signal and the second scan signal may be supplied at the same driving frequency to the pixel circuit PXC and the sensor circuit SSC. The fourth scan signal may also be supplied at the same frequency and timing as the second scan signal. For example, the driving frequency in the normal mode may be set to 60 Hz, 90 Hz, 120 Hz, etc. In an embodiment of the present disclosure, the fourth scan signal may not be supplied in the normal mode.

In a fingerprint sensing mode for fingerprint detection, scan signals may be supplied at a frequency lower than the driving frequency of the normal mode. In particular; in the fingerprint sensing mode, the frequency of the fourth scan signal supplied to the sensor circuit SSC may be lower than those of the first and second scan signals supplied to the pixel circuit PXC to improve the reliability of fingerprint detection and the degree of precision. For example, in the fingerprint sensing mode, the first and second scan signals may be supplied at about 60 Hz, and the fourth scan signal may be supplied at about 30 Hz.

As described above, the fourth scan line S4i is formed separately from other scan lines (e.g., the first and second scan lines S1i and S2i) connected to the pixel circuit PXC, so that the frequency of the fourth scan signal is separated from those of the first and second scan signals. Accordingly, the reliability of fingerprint detection and the degree of precision in the fingerprint sensing mode can be improved.

Figure 11:
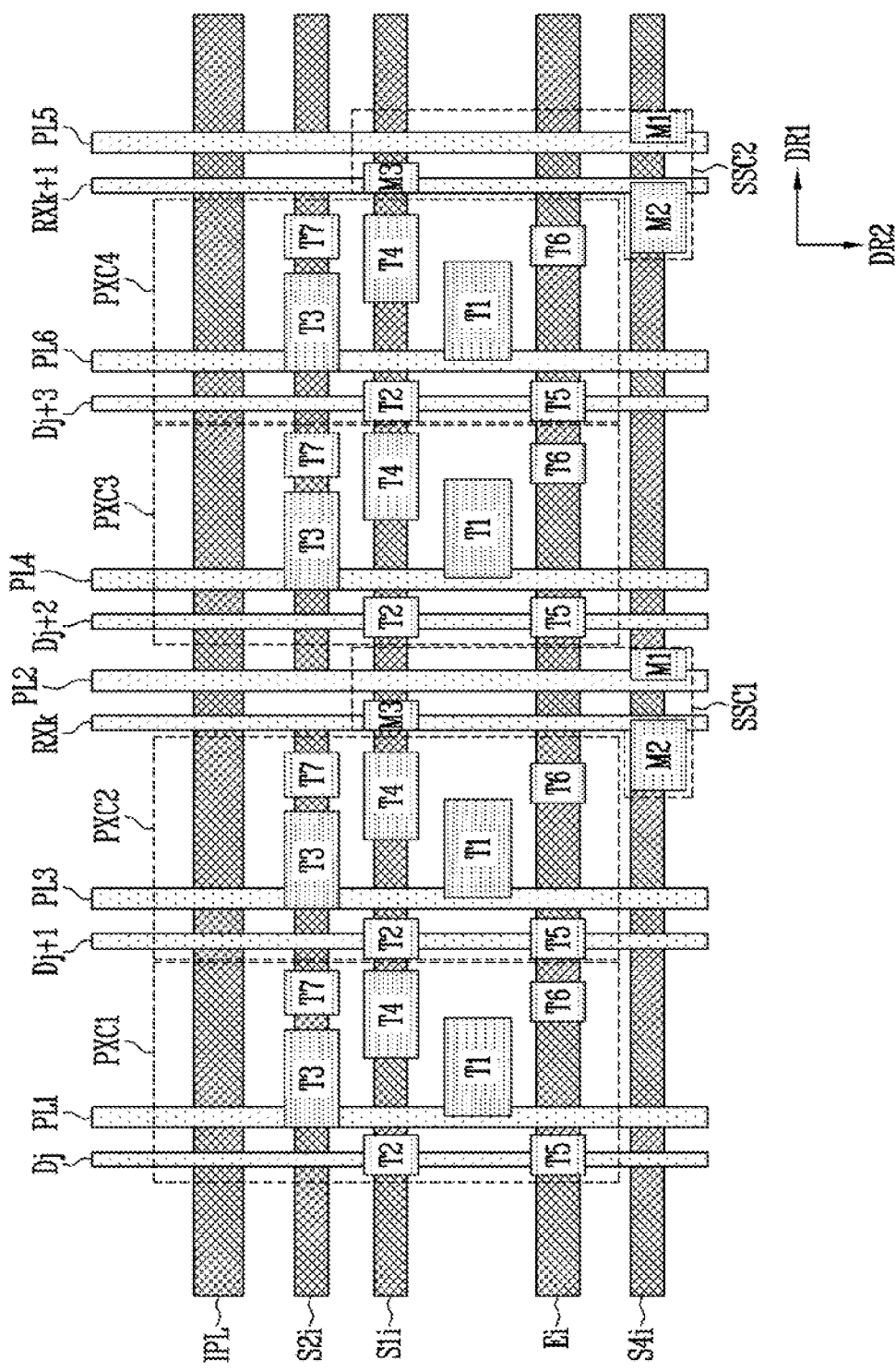
FIG. 11 is a view illustrating an example of lines and transistors, which constitute the pixel and the photo sensor, which are shown in FIG. 10.

FIG. 11 is a view illustrating an example of lines and transistors, which constitute the pixel and the photo sensor, which are shown in FIG. 10.

In FIG. 11, components identical to those described with reference FIG. 4 are designated by like reference numerals, and their overlapping descriptions may be omitted. In addition, a circuit shown in FIG. 11 may have a configuration identical or similar to that of the backplane structure shown in FIG. 4, except for a configuration of the fourth scan line Si, the first sensor transistor M1, and the second sensor transistor M2.

Referring to FIGS. 10 and 11, in the back plane structure of the display panel 100, the ith pixel row may include a plurality of pixel circuits PXC1 to PXC4 and a plurality of sensor circuits SSC1 and SSC2.

The initialization power line IPL, the first scan line S1i, the second scan line S2i, and the emission control line Ei may extend in the first direction DR1. The first scan line S1i, the second scan line S2i, and the emission control line Ei may be spaced apart from each other in the second direction DR2.

In an embodiment of the present disclosure, the gate electrode of the third pixel transistor T3 and the gate electrode of the fourth pixel transistor T4 may be commonly connected to the same second scan line S2i.

In an embodiment of the present disclosure, the fourth scan line S4i may be additionally provided adjacent to the emission control line Ei, and extend in the first direction DR1. In an embodiment of the present disclosure, the second sensor transistor M2 may overlap with the fourth scan line S4i such that the gate electrode of the second sensor transistor M2 is connected to the fourth scan line S4i. In addition, since the first sensor transistor M1 is connected to the second sensor transistor M2, the first sensor transistor M1 and the second sensor transistor M2 may be provided adjacent to each other in the first direction D1. For example, as shown in FIG. 11, the first and second sensor transistors M1 and M2 may overlap the fourth scan line S4i.

As described above, the fourth scan line S4i is provided separately from other scan lines (e.g., the first and second scan lines S1i and S2i) connected to the pixel circuit PXC, so that the reliability of fingerprint detection can be improved.

Figure 12:
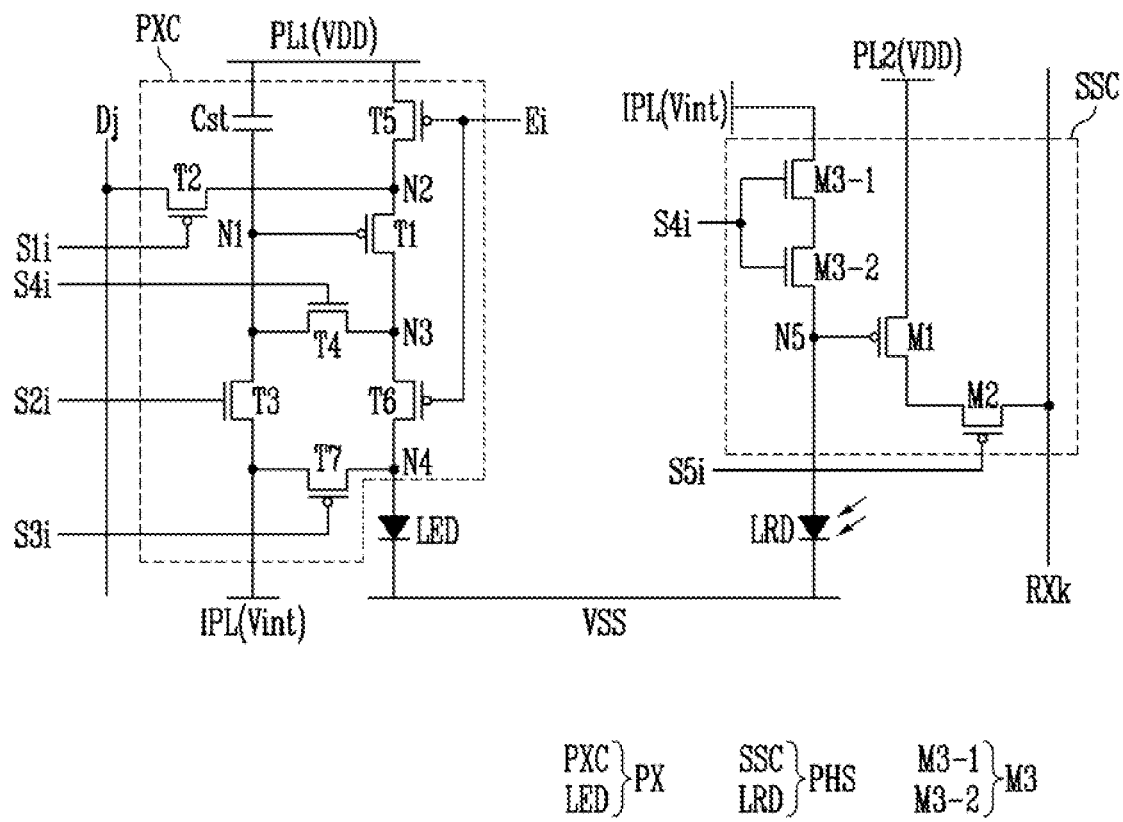
FIG. 12 is a circuit diagram illustrating still another example of the pixel and the photo sensor, which are included in the display area shown in FIG. 2.

FIG. 12 is a circuit diagram illustrating still another example of the pixel and the photo sensor, which are included in the display area shown in FIG. 2.

In FIG. 12, components identical to those described with reference to FIG. 3 are designated by like reference numerals, and their overlapping descriptions may be omitted. In addition, a circuit shown in FIG. 12 may have a configuration identical or similar to the circuit structure shown in FIG. 3, except for the third pixel transistor T3, the fourth pixel transistor T4, the third sensor transistor M3, and some scan lines S4i and S5i.

Referring to FIG. 12, the pixel PX may include a pixel circuit PXC and a light emitting element LED connected thereto, and the photo sensor PHS may include a sensor circuit SSC and a light receiving element LED connected thereto.

Each of the pixel circuit PXC and the sensor circuit SSC may be implemented with a P-type transistor and an N-type transistor. In an embodiment of the present disclosure, the third pixel transistor T3, the fourth pixel transistor T4, and the third sensor transistor M3 may be implemented with an oxide semiconductor transistor. For example, the third pixel transistor T3, the fourth pixel transistor T4, and the third sensor transistor M3 may be implemented with an N-type oxide semiconductor transistor, and include an oxide semiconductor layer as an active layer.

The oxide semiconductor transistor can be formed through a low temperature process, and have a charge mobility lower than that of a poly-silicon semiconductor transistor. In other words, the oxide semiconductor transistor has an excellent off-current characteristic. Thus, leakage at the third pixel transistor T3, the fourth pixel transistor T4, and the third sensor transistor M3 can be minimized.

The gate electrode of the third pixel transistor T3 may be connected to the second scan line S2i, the gate electrode of the seventh pixel transistor T7 may be connected to the third scan line S3i, and the gate electrode of the fourth pixel transistor T4 may be connected to the fourth scan line S4i. In an embodiment of the present disclosure, the gate electrode of the third sensor transistor M3 along with the gate electrode of the fourth pixel transistor T4 may be commonly connected to the fourth scan line S4i.

A gate-on level of the first scan signal supplied to the first scan line S1i and a gate-on level of the third scan signal supplied to the third scan line S3i may be a logic low level. A gate-on level of the second scan signal supplied to the second scan line S2i and a gate-on level of the fourth scan signal supplied to the fourth scan line S4i may be a logic high level.

A timing at which the fourth scan signal is supplied and a timing at which the first scan signal is supplied may be substantially the same. In addition, in the fingerprint sensing mode, the fourth scan signal may be supplied after a fifth scan signal is supplied.

In an embodiment of the present disclosure, the other transistors T1, T2, T5, T6, T7, M1, and M2 except for the third pixel transistor T3, the fourth pixel transistor T4, and the third sensor transistor M3 may be implemented with a poly-silicon transistor, and include a poly-silicon semiconductor layer as an active layer (e.g., a channel). For example, the active layer may be formed through a low-temperature poly-silicon (LTPS) process. For example, the poly-silicon transistor may be a p-type poly-silicon transistor.

Since the poly-silicon semiconductor transistor has a fast response speed, the poly-silicon semiconductor transistor may be applied to a switching element which requires fast switching.

Figure 13:
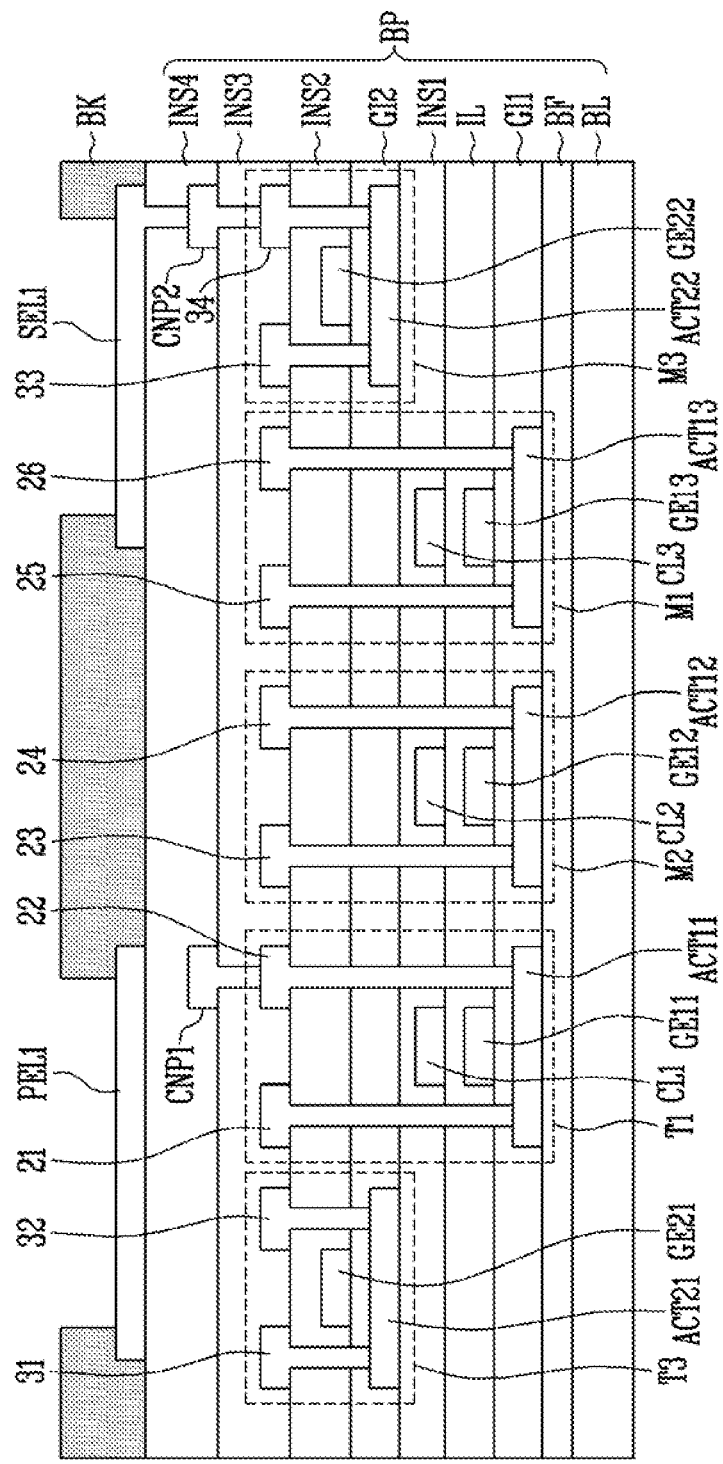
FIG. 13 is a sectional view illustrating an example of a backplane structure of the pixel and the photo sensor, which are shown in FIG. 12.

FIG. 13 is a sectional view illustrating an example of a backplane structure of the pixel and the photo sensor, which are shown in FIG. 12.

In FIG. 13, components identical to those described with reference to FIG. 5 are designated by like reference numerals, and their overlapping descriptions may be omitted.

Referring to FIGS. 1, 12, and 13, pixel transistors T1 to T7 and sensor transistors M1 to M3 may be included in the backplane structure BP.

FIG. 13 illustrates a first pixel transistor T1, a third pixel transistor T3, a first sensor transistor M1, a second sensor transistor M2, and a third sensor transistor M3.

First to third active patterns ACT11, ACT12, and ACT13 may be provided on a buffer layer BF. In an embodiment of the present disclosure, the first, second and third active patterns ACT11, ACT12, and ACT13 may be formed of a poly-silicon semiconductor. For example, the first to third active patterns ACT11, ACT12, and ACT13 may be formed through a low-temperature poly-silicon (LTPS) process.

A first gate insulating layer GI1 may be provided over the first to third active patterns ACT11, ACT12, and ACT13.

First, second and third gate electrodes GE11, GE12, and GE13 may be provided on the first gate insulating layer GI1. The first gate electrode GE11 may overlap with a channel region of the first active pattern ACT11, the second gate electrode GE12 may overlap with a channel region of the second active pattern ACT12, and the third gate electrode GE13 may overlap with a channel region of the third active pattern ACT13.

An interlayer insulating layer IL may be provided over the first to third gate electrodes GE11, GE12, and GE13.

Conductive patterns CL1, CL2, and CL3 may be provided on the interlayer insulating layer IL. The conductive patterns CL1, CL2, and CL3 may form at least one electrode of a storage capacitor Cst, scan lines S1i to S5i, a data line Dj, a readout line RXk, and an initialization power line IPL.

A first insulating layer INS1 may be provided over the conductive patterns CL1, CL2, and CL3.

A fourth active pattern ACT21 and a fifth active pattern ACT22 may be provided on the first insulating layer INS1. In an embodiment of the present disclosure, the fourth and fifth active patterns ACT21 and ACT22 may be formed of an oxide semiconductor. For example, the fourth and fifth active patterns ACT21 and ACT22 may be formed through a metal oxide semiconductor forming process.

A second gate insulating layer GI2 may be provided over the fourth active pattern ACT21 and the fifth active pattern ACT22.

Fourth and fifth gate electrodes GE21 and GE22 may be provided on the second gate insulating layer GI2. The fourth gate electrode GE21 may overlap with a channel region of the fourth active pattern ACT21, and the fifth gate electrode GE22 may overlap with a channel region of the fifth active pattern ACT22.

A second insulating layer INS2 may be provided over the fourth and fifth gate electrodes GE21 and GE22. For example, the second insulating layer INS2 may be an inorganic insulating layer made of an inorganic material.

First source/drain electrodes 21 and 22, second source/drain electrodes 23 and 24, third source/drain electrodes 25 and 26, fourth source/drain electrodes 31 and 32, and fifth source/drain electrodes 33 and 34 may be provided on the second insulating layer INS2. The first to fifth source/drain electrodes 21, 22, 23, 24, 25, 26, 31, 32, 33, and 34 may be connected to the first to fifth active patterns ACT11, AC12, ACT13, ACT21, and ACT22 corresponding thereto through contact holes, respectively.

A third insulating layer INS3 may be provided over the first to fifth source/drain electrodes 21, 22, 23, 24, 25, 26, 31, 32, 33, and 34. For example, the third insulating layer INS3 may be an inorganic insulating layer made of an inorganic material.

Connection patterns CNP1 and CNP2 may be provided on the third insulating layer INS3. A first connection pattern CNP1 may be connected to the first drain electrode 22 through a contact hole penetrating the third insulating layer INS3. A second connection pattern CNP2 may be connected to the fifth source electrode 34 (or drain electrode) through a contact hole penetrating the third insulating layer INS3.

The first and second connection patterns CNP1 and CNP2 may be made of at least one of metals such as gold (Au), silver (Ag), aluminum (Al), molybdenum (Mo), chromium (Cr), titanium (Ti), nickel (Ni), neodymium (Nd), and copper (Cu) or alloys thereof.

A fourth insulating layer INS4 may be disposed over the first and second connection patterns CNP1 and CNP2. The fourth insulating layer INS4 may be an organic insulating layer made of an organic material, or be an inorganic insulating layer made of an inorganic material. In an embodiment of the present disclosure, the fourth insulating layer INS4 may be a planarization layer.

A pixel layer including a first pixel electrode PEL1, a first sensor electrode SEL1, and a bank layer BK may be provided on the fourth insulating layer INS4. The bank layer BK may expose the first pixel electrode PEL1 and the first sensor electrode SEL1. The exposed first pixel electrode PEL1 may overlap the first and third pixel transistors T1 and T3. The exposed first sensor electrode SEL1 may overlap the first and third sensor transistors M1 and M3. A configuration of the pixel layer has been described above with reference to FIGS. 5 and 6, and therefore, overlapping descriptions will be omitted.

Figure 14:
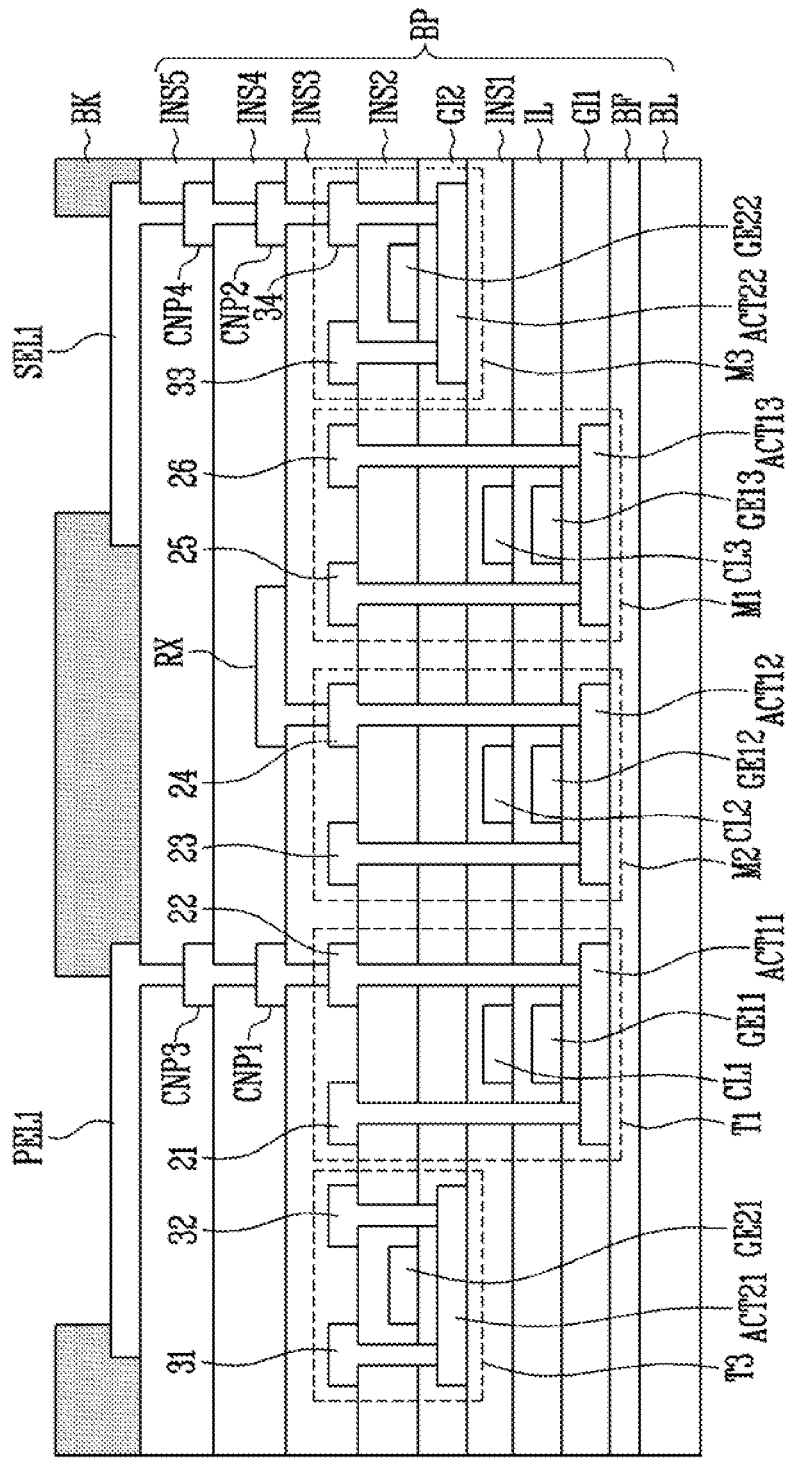
FIG. 14 is a sectional view illustrating another example of the backplane structure of the pixel and the photo sensor, which are shown in FIG. 12.
Figure 15:
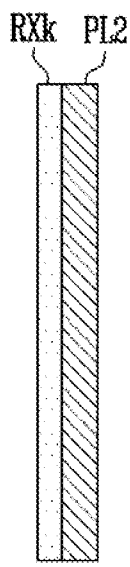
FIG. 15 is a view illustrating a readout line and a power line, which are included in the backplane structure shown in FIG. 14.

FIG. 14 is a sectional view illustrating another example of the backplane structure of the pixel and the photo sensor, which are shown in FIG. 12. FIG. 15 is a view illustrating a readout line and a power line, which are included in the backplane structure shown in FIG. 14.

In FIGS. 14 and 15, components identical to those described with reference to FIGS. 4 and 13 are designated by like reference numerals, and their overlapping descriptions may be omitted.

Referring to FIGS. 1, 12, 14, and 15, pixel transistors T1 to T7 and sensor transistors M1 to M3 may be included in the backplane structure BP.

In an embodiment of the present disclosure, first and second connection patterns CNP1 and CNP2 and a readout conductive layer RX corresponding to a readout line RXk may be provided on a third insulating layer INS3. The readout conductive layer RX may be disposed in a layer higher than that of the scan lines S1i to S5i, the data line Dj, the power lines PL1 and PL2, and the initialization power line IPL.

A fourth insulating layer INS4 may be disposed over the first and second connection patterns CNP1 and CNP2 and the readout conductive layer RX.

Third and fourth connection patterns CNP3 and CNP4 may be provided on the fourth insulating layer INS4. The third connection pattern CNP3 may be connected to the first connection pattern CNP1 through a contact hole penetrating the fourth insulating layer INS4. The fourth connection pattern CNP4 may be connected to the second connection pattern CNP2 through a contact hole penetrating the fourth insulating layer INS4.

A fifth insulating layer INS5 may be disposed over the third and fourth connection patterns CNP3 and CNP4. The fifth insulating layer INS5 may be an organic insulating layer made of an organic material, or be an inorganic insulating layer made of an inorganic material. In an embodiment of the present disclosure, the fifth insulating layer INS5 may be a planarization layer.

A pixel layer including a first pixel electrode PEL1, a first sensor electrode SEL1, and a bank layer BK may be provided on the fifth insulating layer INS5.

In an embodiment of the present disclosure, as shown in FIG. 15, the readout line RXk formed as the readout conductive layer RX may overlap with the entire or a portion of a second power line PL2 adjacent thereto. Thus, the area occupied by the sensor circuit SSC in the first direction DR1 can be decreased. Accordingly, the quality of an image of the display area AA can be increased.

Figure 16:
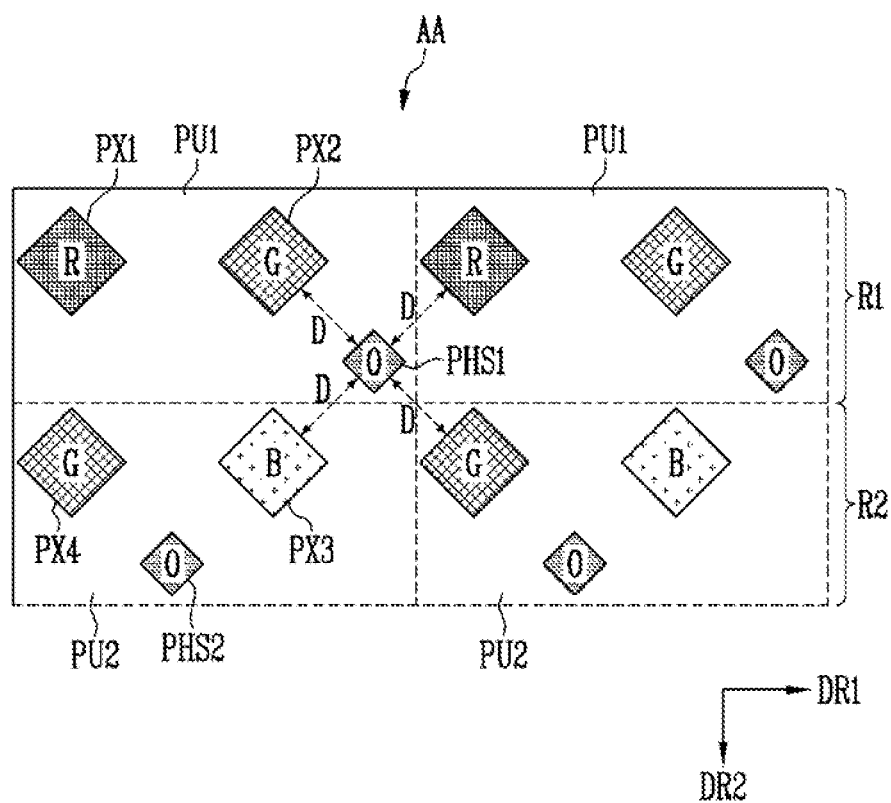
FIG. 16 is a view illustrating another example of the display area of the display panel included in the display device shown in FIG. 1.

FIG. 16 is a view illustrating another example of the display area of the display panel included in the display device shown in FIG. 1.

Referring to FIGS. 1 to 16, a plurality of pixels PX1, PX2, PX3, and PX4 and a plurality of photo sensors PHS1 and PHS2 may be disposed in the display area AA of the display panel 100.

For convenience of description, the pixels PX1, PX2, PX3, and PX4 and the photo sensors PHS1 and PHS2, which are shown in FIG. 16, may be respectively understood as light emitting areas corresponding to light emitting layers and light receiving areas corresponding to light receiving layers, and overlapping descriptions of the components with the same reference numerals, which are described in FIG. 2, may be omitted.

In an embodiment of the present disclosure, a first unit PU1 may be repeated in the first direction DR1 on the first pixel row R1. The first unit PU1 may include a first pixel PX1, a second pixel PX2, and a first photo sensor PHS1. In the first unit PU1, the first pixel PX1, the second pixel PX2, and the first photo sensor PHS1 may be sequentially arranged in the first direction DR1.

In an embodiment of the present disclosure, a second unit PU2 may be repeated in the first direction DR1 on the second pixel row R2. The second unit PU2 may include a third pixel PX3, a fourth pixel PX4, and a second photo sensor PHS2. In the second unit PU2, the fourth pixel PX4, the second photo sensor PHS2 and the third pixel PX3 may be sequentially arranged in the first direction DR1.

Distances D from the light receiving layer (or light receiving area) of the first photo sensor PHS1 to the light emitting layers (or light emitting areas) of the pixels PX1, PX2, PX3, and PX4 adjacent thereto may be substantially the same. Similarly, distances from the light receiving layer (or light receiving area) of the second photo sensor PHS2 to the light emitting layers (or light emitting areas) of the pixels PX1, PX2, PX3, and PX4 adjacent thereto may be substantially the same. For example, the distance D between the pixel PX2 of the leftmost first unit PU1 and the first photo sensor PHS1 and the distance D between the pixel PX3 of the leftmost second unit PU1 and the first photo sensor PHS1 may be the same.

The first unit PU1 and the second unit PU2 may be alternately provided in the second direction DR2.

Figure 17:
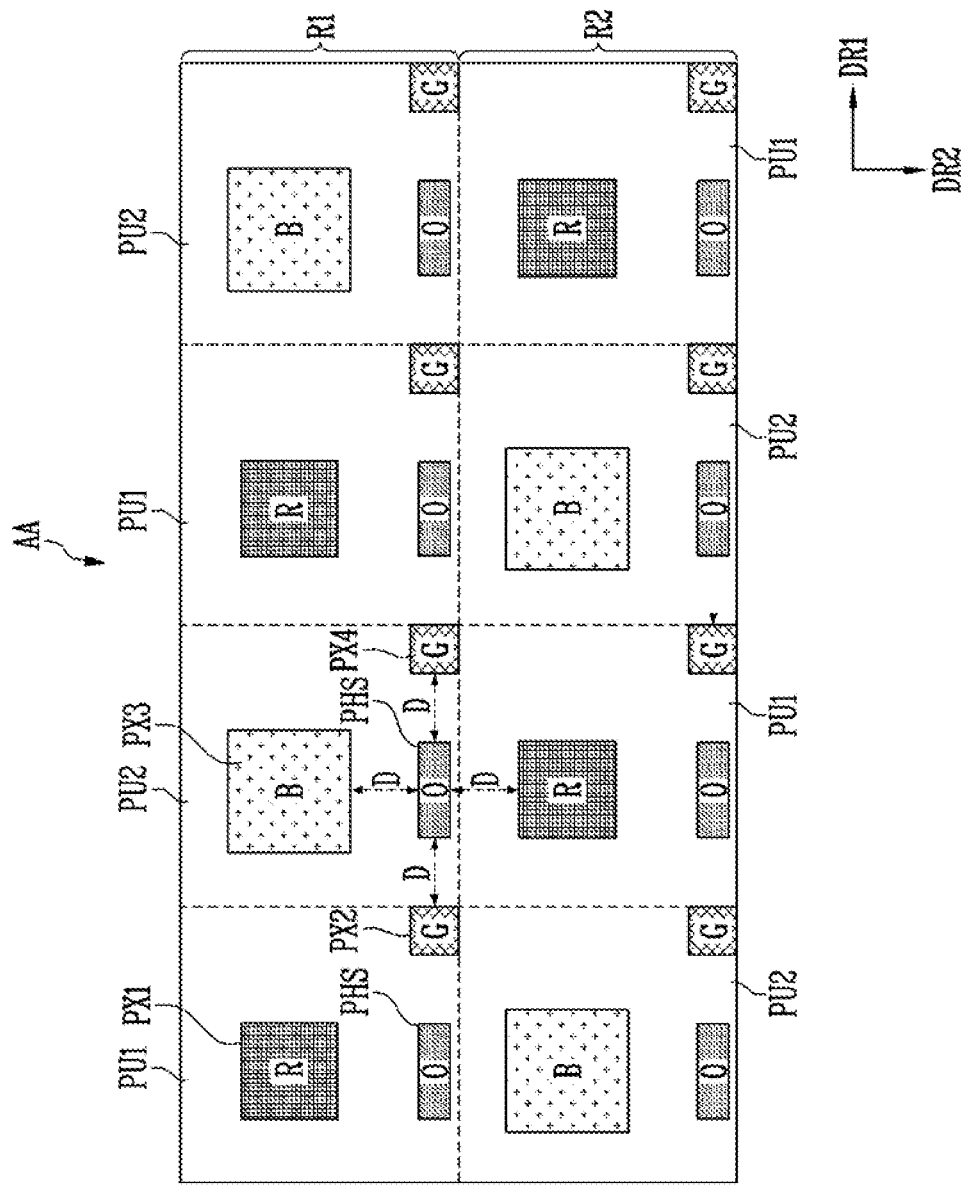
FIG. 17 is a view illustrating still another example of the display area of the display panel included in the display device shown in FIG. 1.

FIG. 17 is a view illustrating still another example of the display area of the display panel included in the display device shown in FIG. 1.

Referring to FIGS. 1 and 17, a plurality of pixels PX1, PX2, PX3, and PX4 and a plurality of photo sensors PHS may be disposed in the display area AA of the display panel 100.

In an embodiment of the present disclosure, a first unit PU1 and a second unit PU2 may be alternately disposed in each of the first direction DR1 and the second direction DR2.

The first unit PU1 may include a first pixel PX1, a second pixel PX2, and a photo sensor PHS. In an embodiment of the present disclosure, the photo sensor PHS may be disposed between the first pixel PX1 and the second pixel PX2. For example, a light emitting layer of the first pixel PX1 may be disposed at the upper side of a light receiving layer of the photo sensor PHS while being spaced apart from the light receiving layer of the photo sensor PHS, and a light emitting layer of the second pixel PX2 may be disposed at a right side of the light receiving layer of the photo sensor while being spaced apart from the light receiving layer of the photo sensor.

The second unit PU2 may include a third pixel PX3, a fourth pixel PX4, and a photo sensor PHS. In an embodiment of the present disclosure, the photo sensor PHS may be disposed between the third pixel PX3 and the fourth pixel PX4. For example, a light emitting layer of the third pixel PX3 may be disposed at an upper side of a light receiving layer of the photo sensor PHS while being spaced apart from the light receiving layer of the photo sensor PHS, and a light emitting layer of the fourth pixel PX4 may be disposed at a right side of the light receiving layer of the photo sensor PHS while being spaced apart from the light receiving layer of the photo sensor PHS.

Distances D from the light receiving layer (or light receiving area) of the photo sensor PHS to the light emitting layers of the pixels PX1, PX2, PX3, and PX4 adjacent thereto may be substantially the same.

As described above, the display device in accordance with the embodiments of the present disclosure may include a light receiving element provided in the same layer as a light emitting element. In addition, a black matrix which functions as an optical pass (e.g., an optical system) of incident light supplied to the light receiving element and blocks reflection of external light and color filters may be directly disposed on an encapsulation or a touch sensor layer. Thus, the amount of incident light provided to the light receiving element may be increased, and the thickness of the display device may be decreased. Accordingly, the light sensing performance of a photo sensor may be improved.

Further, a sensor circuit is also provided in a backplane structure in which a pixel circuit is formed, so that the pixel circuit and the sensor circuit may share at least some signal lines (e.g., scan lines and an initialization power line). Thus, the manufacturing cost of the display device may be reduced, and the power consumption of the display device may be minimized.

Example embodiments of the present disclosure have been disclosed herein, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singularly or in combination with features, characteristics, and/or elements described in connection with other embodiments unless otherwise specifically indicated. Accordingly, it will be understood by those of skill in the art that various changes in form and details may be made within the scope of the present disclosure as set forth in the following claims.

What is claimed is:

1. A display device comprising:
   a base layer;
   a backplane structure provided on the base layer, the backplane structure including pixel circuits and a sensor circuit;
   a pixel layer provided on the backplane structure, the pixel layer including light emitting elements respectively connected to the pixel circuits and a light receiving element connected to the sensor circuit;
   an encapsulation layer covering the pixel layer;
   a light blocking member provided on the encapsulation layer, wherein the light blocking member includes openings overlapping the light emitting elements and the light receiving element; and
   a color filter provided on the encapsulation layer and covering the light blocking member,
   wherein the light emitting elements include light emitting layers, the light receiving element includes a light receiving layer, and at least one of the openings of the light blocking member overlaps one of the light emitting layers and the light receiving layer,
   wherein a pixel circuit disposed on a pixel row among the pixel circuits comprises:
   a first pixel transistor for receiving a voltage of a first power source from a first power line and generating a driving current supplied to one of the light emitting elements;
   a second pixel transistor connected between a data line and a first electrode of the first pixel transistor, the second pixel transistor including a gate electrode connected to a first scan line; and
   a third pixel transistor connected between a gate electrode of the first pixel transistor and an initialization power line, the third pixel transistor including a gate electrode connected to a second scan line, and
   wherein the sensor circuit disposed on the pixel row comprises:
   a first sensor transistor and a second sensor transistor, connected in series between a second power line to which the voltage of the first power source is supplied and a readout line; and
   a third sensor transistor connected between the initialization power line and the light receiving element.

2. The display device of claim 1, wherein an area of at least one of the openings is smaller than an area of the light receiving layer.

3. The display device of claim 2, further comprising:
   a touch sensor layer provided between the encapsulation layer and the light blocking member.

4. The display device of claim 1, wherein each of the light emitting elements comprises:
   a first pixel electrode provided on the backplane structure;
   a light emitting layer disposed on the first pixel electrode; and
   a second pixel electrode disposed on the light emitting layer.

5. The display device of claim 4, wherein the light receiving element comprises:
   a first sensor electrode disposed in the same layer as the first pixel electrode;
   a light receiving layer disposed on the first sensor electrode; and
   a second sensor electrode disposed on the light receiving layer, and
   wherein the second pixel electrode and the second sensor electrode are disposed in the same layer.

6. The display device of claim 5, wherein the pixel layer further comprises:
   a bank layer covering a portion of the first pixel electrode and a portion of the first sensor electrode and forming a light emitting area and a light receiving area.

7. The display device of claim 6, wherein distances between respective light emitting layers of light emitting elements adjacent to the light receiving element and the light receiving layer are substantially the same.

8. The display device of claim 7, wherein the light emitting layers adjacent to the light receiving element include a first light emitting layer, a second light emitting layer, a third light emitting layer, and a fourth light emitting layer, and
   wherein the first light emitting layer and the fourth light emitting layer emit a first color, the second light emitting layer emits a second color, and the third light emitting layer emits a third color.

9. The display device of claim 8, wherein the first light emitting layer and the fourth light emitting layer are opposite to each other with respect to the light receiving layer in a plan view.

10. The display device of claim 6, wherein an area of the light receiving area is smaller than an area of the light emitting area.

11. The display device of claim 5, wherein each of the light emitting elements further comprises:
    a hole transport layer disposed between the first pixel electrode and the light emitting layer; and an electron transport layer disposed between the light emitting layer and the second pixel electrode.

12. The display device of claim 5, wherein the light receiving element further comprises:
a hole transport layer disposed between the first sensor electrode and the light receiving layer; and
an electron transport layer disposed between the light receiving layer and the second sensor electrode, and
wherein the electron transport layer extends onto the light emitting layer.

13. The display device of claim 12, wherein the light receiving layer includes a low molecular organic material.

14. The display device of claim 1, wherein a gate electrode of the third sensor transistor is connected together with the gate electrode of the second pixel transistor to the first scan line.

15. The display device of claim 14, wherein a gate electrode of the second sensor transistor is connected together with the gate electrode of the third pixel transistor to the second scan line.

16. The display device of claim 1, wherein the pixel circuit further includes a fourth pixel transistor connected between a second electrode of the first pixel transistor and the gate electrode of the first pixel transistor, the fourth pixel transistor including a gate electrode connected to a third scan line, and
wherein a gate electrode of the third sensor transistor is connected together with the gate electrode of the fourth pixel transistor to the third scan line.

17. The display device of claim 1, wherein the initialization power line extends in a first direction in an area corresponding to the pixel row, and
the first power line, the second power line, and the readout line extend in a second direction and are spaced apart from each other in the area corresponding to the pixel row.

18. The display device of claim 17, wherein the readout line is disposed on the second power line, and extends while overlapping the second power line.

19. The display device of claim 1, wherein, in an area corresponding to the pixel row, two pixel circuits are disposed between readout lines adjacent to each other.

20. The display device of claim 1, wherein the light blocking member includes a black matrix.

* * * * *